(12) United States Patent
Park et al.

(10) Patent No.: US 11,658,139 B2
(45) Date of Patent: May 23, 2023

(54) SEMICONDUCTOR PACKAGE FOR IMPROVING BONDING RELIABILITY

(71) Applicant: Samsung Electronics Co., Ltd., Suwon-si (KR)

(72) Inventors: Jaehyung Park, Anyang-si (KR); Seokho Kim, Hwaseong-si (KR); Hoonjoo Na, Seoul (KR); Seongmin Son, Hwaseong-si (KR); Kyuha Lee, Seongnam-si (KR); Yikoan Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 17/206,337

(22) Filed: Mar. 19, 2021

(65) Prior Publication Data
US 2022/0037273 A1 Feb. 3, 2022

(30) Foreign Application Priority Data
Jul. 29, 2020 (KR) .................. 10-2020-0094794

(51) Int. Cl.
*H01L 23/00* (2006.01)
*H01L 25/065* (2023.01)
*H01L 25/18* (2023.01)

(52) U.S. Cl.
CPC .............. *H01L 24/06* (2013.01); *H01L 24/05* (2013.01); *H01L 24/08* (2013.01); *H01L 24/32* (2013.01); *H01L 25/0657* (2013.01); *H01L 25/18* (2013.01); *H01L 2224/05013* (2013.01); *H01L 2224/05014* (2013.01);
(Continued)

(58) Field of Classification Search
CPC ......... H01L 24/05; H01L 24/08; H01L 24/32; H01L 25/0657; H01L 2224/05013; H01L 2224/05014; H01L 2224/05554; H01L 2224/05562; H01L 2224/05564; H01L 2224/0603; H01L 2224/06051; H01L 24/06; H01L 2224/06135; H01L 2224/06136; H01L 2224/06177;
(Continued)

(56) References Cited

U.S. PATENT DOCUMENTS 7,078,811 B2 7/2006 Suga
8,368,222 B2 2/2013 Okuyama
(Continued)

*Primary Examiner* — Jasmine J Clark
(74) *Attorney, Agent, or Firm* — Muir Patent Law, PLLC

(57) ABSTRACT

A semiconductor package includes main pad structures and dummy pad structures between a first semiconductor chip and a second semiconductor chip. The main pad structures include first main pad structures apart from one another on the first semiconductor chip and second main pad structures placed apart from one another on the second semiconductor chip and bonded to the first main pad structures. The dummy pad structures include first dummy pad structures including first dummy pads apart from one another on the first semiconductor chip and first dummy capping layers on the first dummy pads, and second dummy pad structures including second dummy pads apart from one another on the second semiconductor chip and second dummy capping layers on the second dummy pads. The first dummy capping layers of the first dummy pad structures are not bonded to the second dummy capping layers of the second dummy pad structures.

20 Claims, 27 Drawing Sheets

(52) U.S. Cl.
CPC ............... *H01L 2224/05124* (2013.01); *H01L 2224/05139* (2013.01); *H01L 2224/05147* (2013.01); *H01L 2224/05157* (2013.01); *H01L 2224/05176* (2013.01); *H01L 2224/05554* (2013.01); *H01L 2224/05562* (2013.01); *H01L 2224/05564* (2013.01); *H01L 2224/05624* (2013.01); *H01L 2224/05638* (2013.01); *H01L 2224/05649* (2013.01); *H01L 2224/05666* (2013.01); *H01L 2224/0603* (2013.01); *H01L 2224/06051* (2013.01); *H01L 2224/06131* (2013.01); *H01L 2224/06135* (2013.01); *H01L 2224/06136* (2013.01); *H01L 2224/06177* (2013.01); *H01L 2224/06505* (2013.01); *H01L 2224/06517* (2013.01); *H01L 2224/08145* (2013.01); *H01L 2224/32145* (2013.01)

(58) Field of Classification Search
CPC . H01L 2224/06517; H01L 2224/08145; H01L 2224/32145
See application file for complete search history.

(56) References Cited

U.S. PATENT DOCUMENTS

| | | |
|---|---|---|
| 8,618,667 B2 | 12/2013 | Takeda et al. |
| 9,412,725 B2 | 8/2016 | Chen et al. |
| 9,953,941 B2 | 4/2018 | Enquist |
| 10,050,018 B2 | 8/2018 | Wu et al. |
| 2020/0098711 A1 | 3/2020 | Choi et al. |
| 2021/0057371 A1 | 2/2021 | Park et al. |
| 2021/0280545 A1* | 9/2021 | Watanabe ............... H01L 24/06 |

* cited by examiner

SEMICONDUCTOR PACKAGE FOR IMPROVING BONDING RELIABILITY

CROSS-REFERENCE TO RELATED APPLICATION

This application is based on and claims priority under 35 U.S.C. § 119 to Korean Patent Application No. 10-2020-0094794, filed on Jul. 29, 2020, in the Korean Intellectual Property Office, the disclosure of which is incorporated by reference herein in its entirety.

BACKGROUND

The inventive concept relates to a semiconductor package, and more particularly, to a semiconductor package capable of improving bonding reliability.

Along with the trend of multifunction, high-capacity, and miniaturization of electronic products, a semiconductor package completed by bonding two or more semiconductor chips has been proposed. In such semiconductor packages, bonding reliability between two or more semiconductor chips is important. When the bonding reliability of a semiconductor package is low, functions of the semiconductor package may not be properly performed.

SUMMARY

The inventive concept provides a chip stack semiconductor package capable of improving bonding reliability.

According to an aspect of the inventive concept, there is provided a semiconductor package including a first semiconductor chip; a second semiconductor chip above the first semiconductor chip; and main pad structures and dummy pad structures between the first semiconductor chip and the second semiconductor chip.

The main pad structures include first main pad structures apart from one another on the first semiconductor chip and second main pad structures apart from one another on the second semiconductor chip, the second main pad structures bonded to the first main pad structures.

The dummy pad structures include first dummy pad structures including first dummy pad apart from one another on the first semiconductor chip and first dummy capping layers on the first dummy pads, and second dummy pad structures including second dummy pads apart from one another on the second semiconductor chip and second dummy capping layers on the second dummy pads. The first dummy capping layers of the first dummy pads are not bonded to the second dummy capping layers of the second dummy pad structures.

According to another aspect of the inventive concept, there is provided a semiconductor package including a first semiconductor chip, a second semiconductor chip above the first semiconductor chip, and main pad structures and dummy pad structures between the first semiconductor chip and the second semiconductor chip.

The main pad structures include first main pad structures including first main pads apart from one another on the first semiconductor chip and first main capping layers on the first main pads, and second main pad structures including second main pads apart from one another on the second semiconductor chip and second main capping layers on the second main pads.

The first main capping layers of the first main pad structures are bonded to the second main capping layers of the second main pad structures, and the dummy pad structures include first dummy pad structures including first dummy pads apart from one another on the first semiconductor chip and first dummy capping layers on the first dummy pads, and second dummy pad structures including second dummy pads apart from one another on the second semiconductor chip and second dummy capping layers on the second dummy pads. The first dummy capping layers of the first dummy pads are not bonded to the second dummy capping layers of the second dummy pad structures.

According to another aspect of the inventive concept, there is provided a semiconductor package including a first semiconductor chip; a second semiconductor chip above the first semiconductor chip; main pad structures and dummy pad structures between the first semiconductor chip and the second semiconductor chip; and bonding insulating layers between the first semiconductor chip and the second semiconductor chip, the bonding insulating layers configured to insulate the main pad structure and the dummy pad structures.

The main pad structures include first main pad structures including first main pads apart from one another on the first semiconductor chip and first main capping layers on the first main pads, and second main pad structures including second main pads apart from one another on the second semiconductor chip and second main capping layers on the second main pads. The first main capping layers of the first main pad structures are bonded to the second main capping layers of the second main pad structures.

The dummy pad structures include first dummy pad structures including first dummy pad apart from one another on the first semiconductor chip and first dummy capping layers on the first dummy pads, and second dummy pad structures including second dummy pads apart from one another on the second semiconductor chip and second dummy capping layers on the second dummy pads.

The bonding insulating layers include, on the first semiconductor chip, a first bonding insulating layer configured to insulate the first main pad structures and the first dummy pad structures, and include, on the second semiconductor chip, a second bonding insulating configured to insulate the second main pad structures and the second dummy pad structures. The second dummy capping layers are bonded to the first bonding insulating layer, and the first dummy capping layers are bonded to the second bonding insulating layer.

BRIEF DESCRIPTION OF THE DRAWINGS

Embodiments of the inventive concept will be more clearly understood from the following detailed description taken in conjunction with the accompanying drawings in which like reference numbers refer to like elements throughout. In the drawings.

DETAILED DESCRIPTION OF THE EMBODIMENTS

Hereinafter, example embodiments will be described in detail with reference to the accompanying drawings. The following embodiments of the inventive concept may be implemented by only one embodiment, and the following embodiments may also be implemented by combination of one or more embodiments. Accordingly, the inventive concept is not limited to one embodiment. In the present specification, unless the context clearly indicates otherwise, singular forms of components may include plural forms. In the present specification, drawings are exaggerated for more clear description of the inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
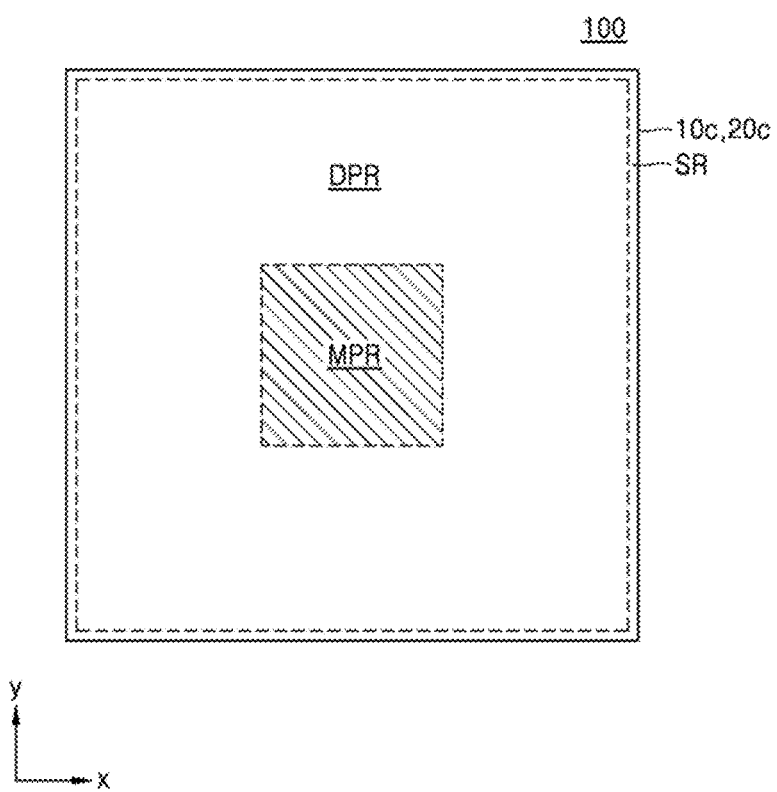
FIG. 1 is a top-plan view of a semiconductor package, according to an example embodiment of the inventive concept.
Figure 2:
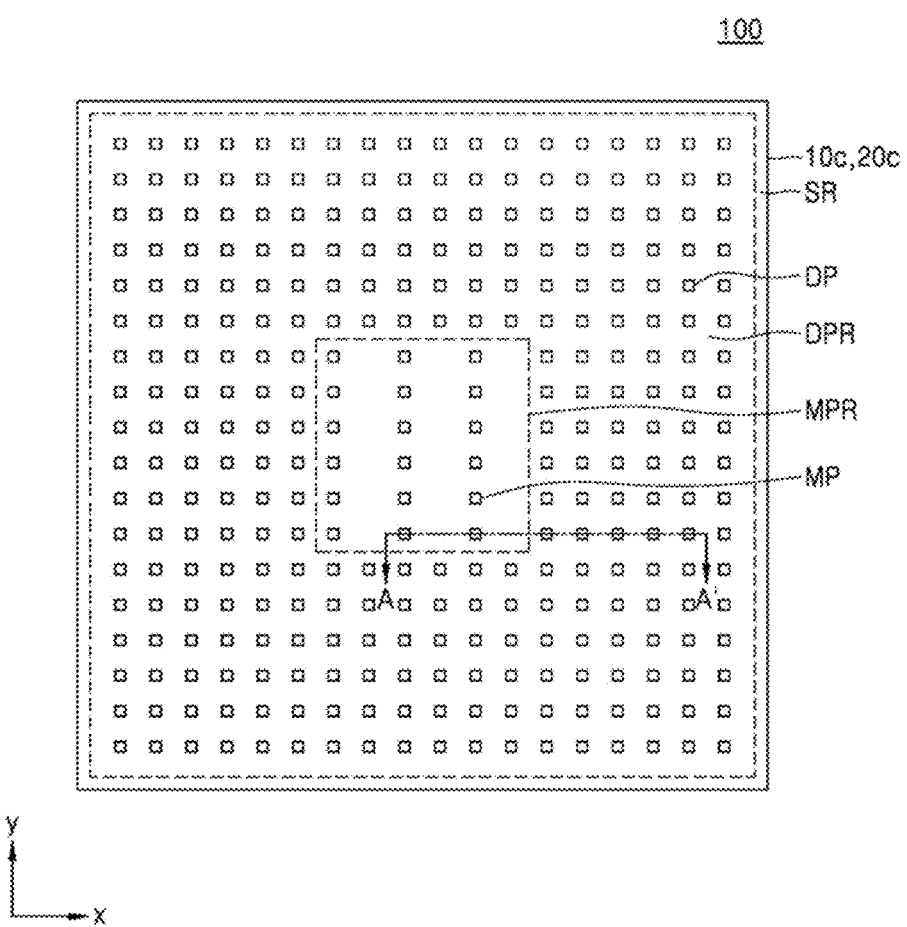
FIG. 2 is a top-plan view illustrating a pad arrangement of the semiconductor package shown in FIG. 1.
Figure 3:
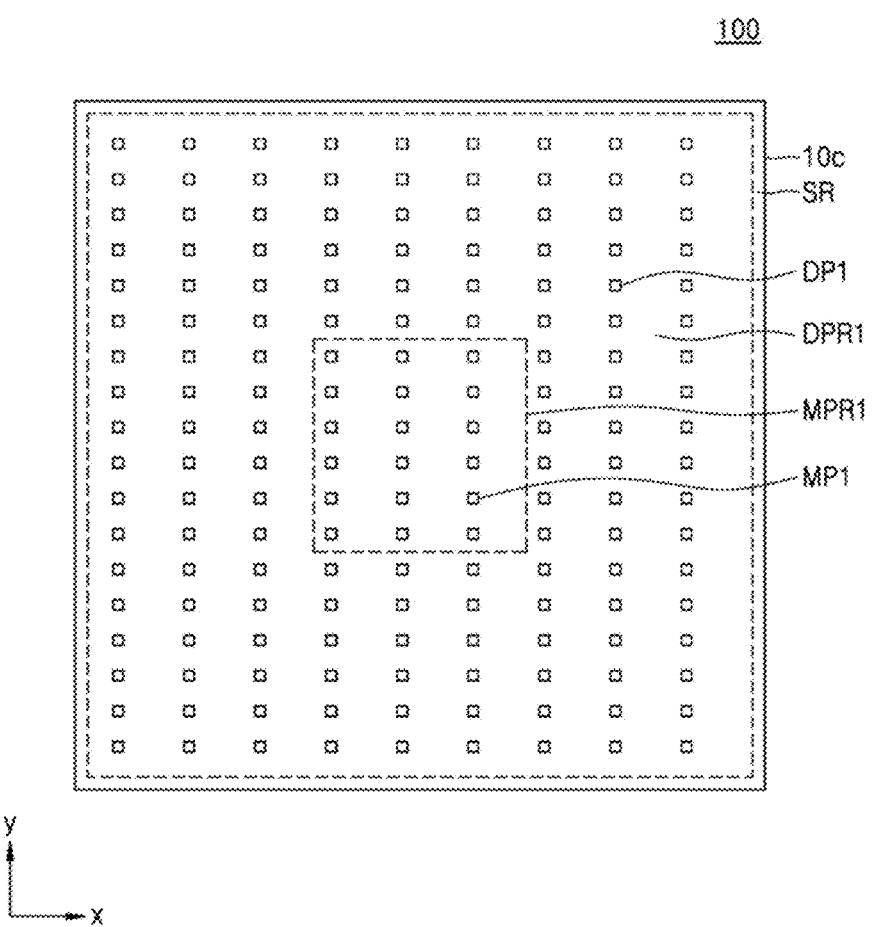
FIGS. 3 and 4 are top-plan views respectively illustrating pad arrangements of a first semiconductor chip shown in FIG. 1 and a second semiconductor chip shown in FIG. 2.
Figure 4:
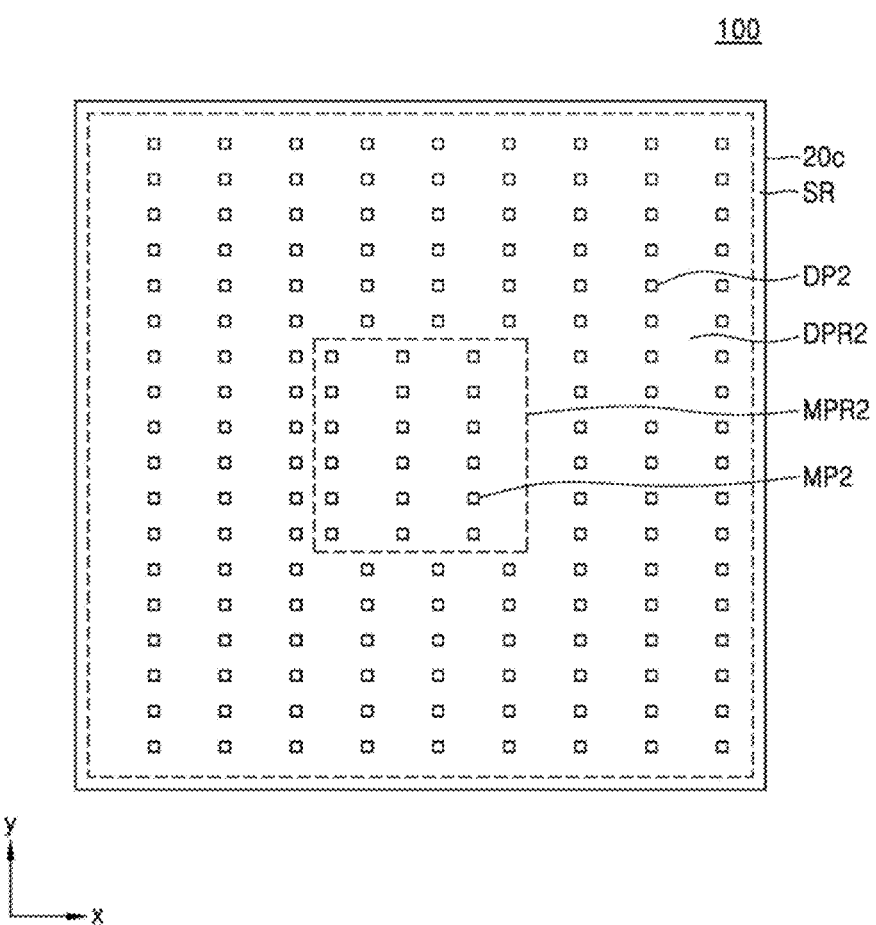

FIG. 1 is a top-plan view of a semiconductor package, according to an example embodiment of the inventive concept, FIG. 2 is a top-plan view of a pad arrangement of the semiconductor package shown in FIG. 1, and FIGS. 3 and 4 are top-plan views respectively showing pad arrangements of a first semiconductor chip shown in FIG. 1 and a second semiconductor chip shown in FIG. 2.

As shown in FIGS. 1 and 2, a semiconductor package 100 may have a structure in which a first semiconductor chip 10c and a second semiconductor chip 20c are bonded (joined) to each other. The semiconductor package 100 may have a structure in which the second semiconductor chip 20c is stacked on and bonded (joined) to the first semiconductor chip 10c. The semiconductor package 100 may have a width in the X direction (the first direction) and a length in the Y direction (the second direction). The width in the X direction and the length in the Y direction may be variously modified according to structures of the package.

In each of the first semiconductor chip 10c and the second semiconductor chip 20c, a main pad region MPR may be arranged in a center region, a scribe line region SR may be arranged in an edge region, and a dummy pad region DPR may be provided between the main pad region MPR and the scribe line region SR. The dummy pad region DPR may be a peripheral region surrounding the main pad region MPR. The scribe line region SR may surround the dummy pad region DPR.

Main pad structures MP arranged apart from another may be arranged in the main pad region MPR. The main pad structures MP may be referred to as bonding pad structures. The main pad structures MP may be structures electrically connecting the first semiconductor chip 10c to the second semiconductor chip 20c. The main pad structures MP may be arranged in central regions of the first semiconductor chip 10c and the second semiconductor chip 20c in a planar manner.

Dummy pad structures DP arranged apart from one another may be arranged in the dummy pad region DPR. The dummy pad structures DP may be arranged to surround the main pad structures MP in peripheral regions of the first semiconductor chip 10c and the second semiconductor chip 20c in a planar manner. The dummy pad structures DP may be structures that do not electrically connect the first semiconductor chip 10c to the second semiconductor chip 20c. The dummy pad structures DP may be provided to adjust the pad density between the main pad region MPR and the dummy pad region DPR.

As shown in FIG. 3, the first semiconductor chip 10c may include a first main pad region MPR1 included in the main pad region MPR. First main pad structures MP1 arranged apart from one another may be arranged in the first main pad region MPR1. The first main pad structures MP1 may be referred to as first bonding pad structures. The first semiconductor chip 10c may include a first dummy pad region DPR1 included in the dummy pad region DPR. First dummy pad structures DP1 arranged apart from one another may be arranged in the first dummy pad region DPR1.

The first dummy pad structures DP1 may be provided to adjust the pad density between the first main pad region MPR1 and the first dummy pad region DPR1. A first main pad density of the first main pad region MPR1 may be a ratio of a total area of the first main pad structures MP1 to an area of the first main pad region MPR1. A first dummy pad density of the first dummy pad region DPR1 may be a ratio of a total area of the first dummy pad structures DP1 to an area of the first dummy pad region DPR1.

The first dummy pad density may be equal or similar to the first main pad density. When the first dummy pad density is equal or similar to the first main pad density, a surface planarity between the first main pad region MPR1 and the first dummy pad region DPR1 may be improved by suppressing dishing or erosion in the first dummy pad region DPR1 in a chemical mechanical polishing (CMP) process for manufacturing the first semiconductor chip 10c.

As shown in FIG. 2, the second semiconductor chip 20c may include a second main pad region MPR2 included in the main pad region MPR. Second main pad structures MP2 arranged apart from one another may be arranged in the second main pad region MPR2. The second main pad structures MP2 may be referred to as second bonding pad structures. The second main pad structures MP2 may be bonded (joined) to the first main structures MP1 of the first semiconductor chip 10c.

The second semiconductor chip 20c may include a second dummy pad region DPR2 included in the dummy pad region DPR. Second dummy pad structures DP2 arranged apart from one another may be arranged in the second dummy pad region DPR2. The second dummy pad structures DP2 may not be bonded to the first dummy pad structures DP1 of the first semiconductor chip 10c.

In some embodiments, compared to the first dummy pad structures DP1, the second dummy pad structures DP2 may be arranged to be shifted in the X direction. Although not shown in FIGS. 3 and 4, compared to the first dummy pad structures DP1, the second dummy pad structures DP2 may be arranged to be shifted in at least one of the X direction and Y direction.

The second dummy pad structures DP2 may be provided to adjust pad densities between the second main pad region MPR2 and the second dummy pad region DPR2. A second main pad density of the second main pad region MPR2 may be a ratio of a total area of the second main pad structures MP2 to an area of the second main pad region MPR2. A second dummy pad density of the second dummy pad region DPR2 may be a ratio of a total area of the second dummy pad structures DP2 to an area of the second dummy pad region DPR2.

The second dummy pad density may be equal or similar to the second main pad density. When the second dummy pad density is equal or similar to the second main pad density, a surface planarity between the second main pad region MPR2 and the second dummy pad region DPR2 may be improved by suppressing dishing or erosion in the second dummy pad region DPR2 in the CMP process for manufacturing the second semiconductor chip 20c.

Although FIGS. 3 through 4 illustrate that all of the first main pad structure MP1, the second main pad structure MP2, the first dummy pad structure DP1, and the second dummy pad structure DP2 have a square plane shape, the plane shape is not limited thereto. For example, all of the first main pad structure MP1, the second main pad structure MP2, the first dummy pad structure DP1, and the second dummy pad structure DP2 may be implemented in various shapes such as a rectangle, a diamond, a rounded square, a rounded rectangle, an oval, and a circle.

Although FIGS. 3 through 4 illustrate the first dummy pad structure DP1 and the second dummy pad structure DP2 are not arranged in the scribe line region SR, the first dummy pad structure DP1 and the second dummy pad structure DP2 may be arranged in at least a portion of the scribe line region SR.

Figure 5:
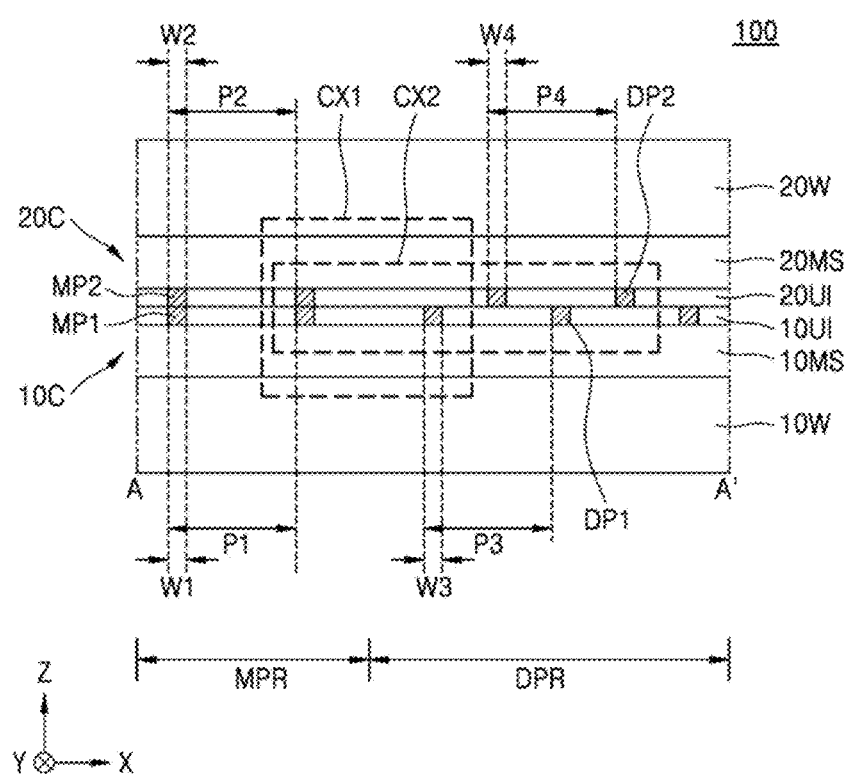
FIG. 5 is a cross-sectional view taken along line A-A' shown in FIG. 2.
Figure 6A:
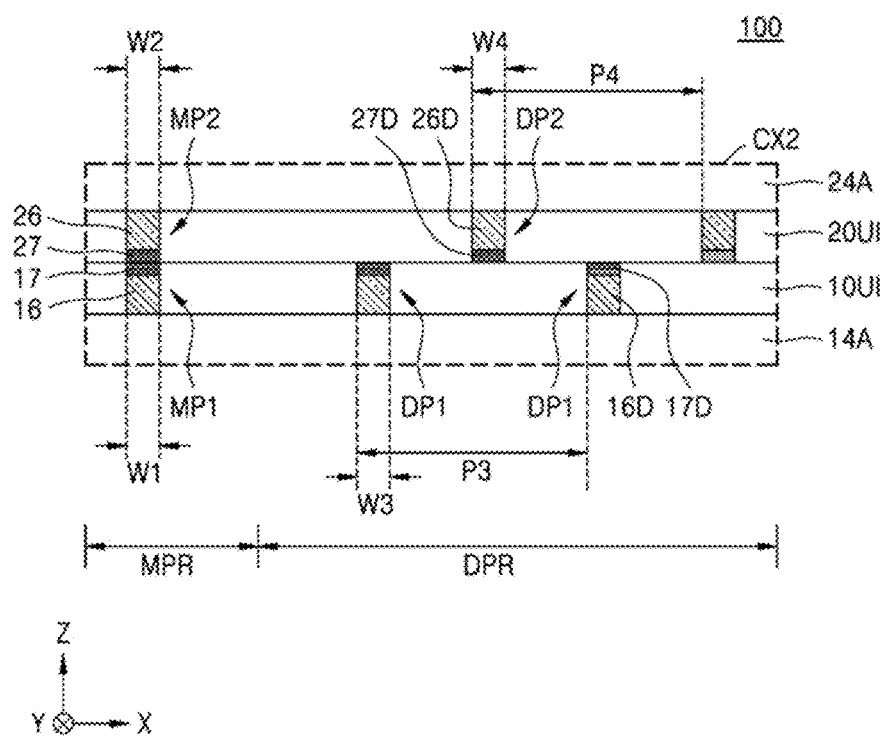
FIGS. 6A and 6B are enlarged diagrams for describing portion CX2 shown in FIG. 5.
Figure 6B:
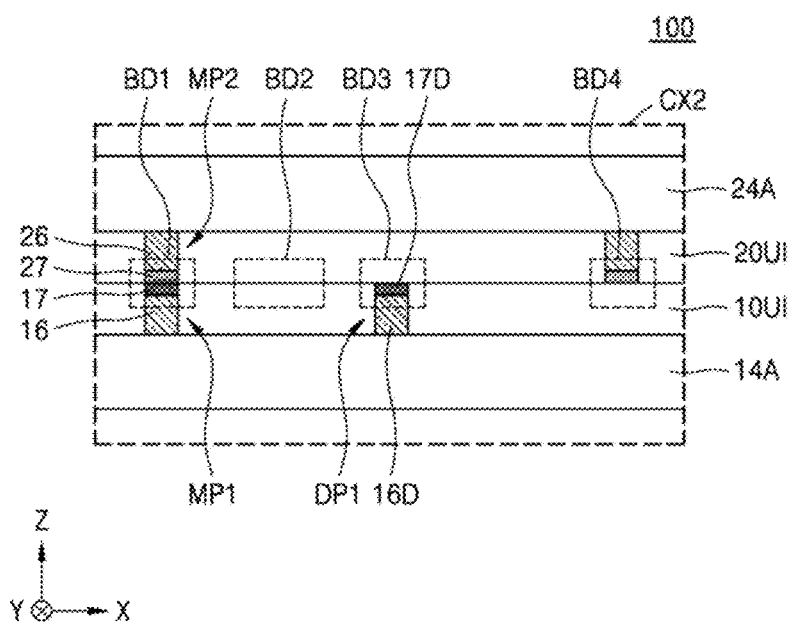
Figure 7:
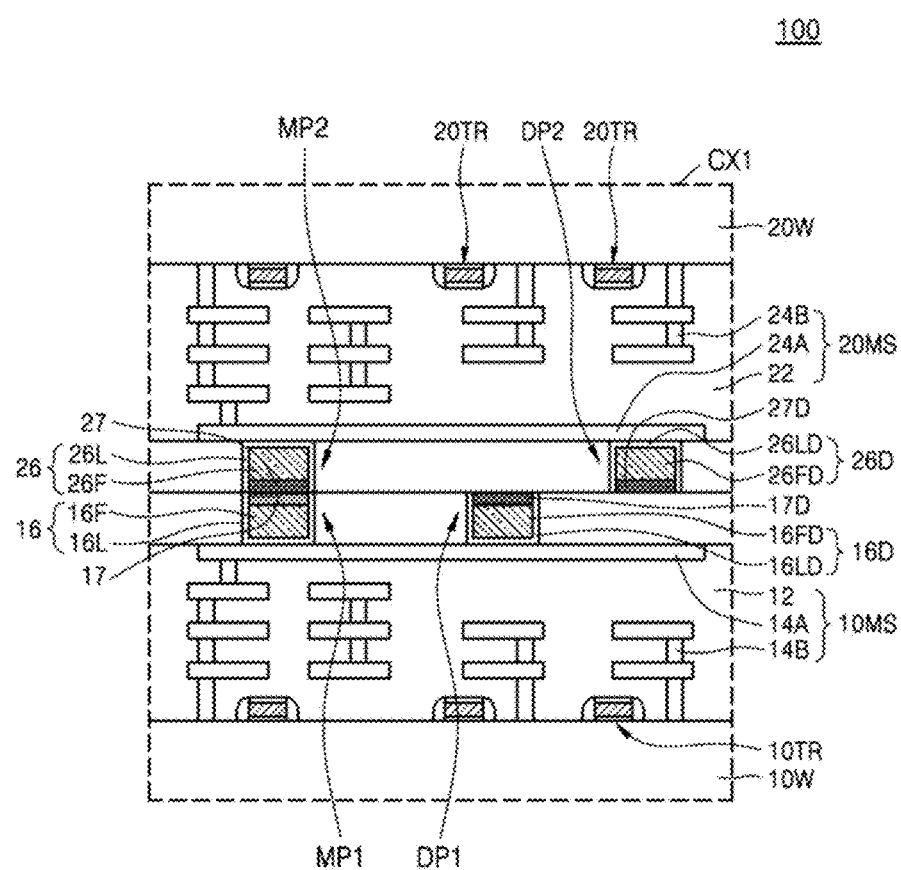
FIG. 7 is an enlarged diagram for describing portion CX1 shown in FIG. 5.

FIG. 5 is a cross-sectional view taken along line A-A' shown in FIG. 2, FIGS. 6A and 6B are enlarged views for describing portion CX2 shown in FIG. 5, and FIG. 7 is an enlarged view for describing portion CX1 shown in FIG. 5.

In detail, the semiconductor package 100 may include the second semiconductor chip 20c arranged (or bonded) on the first semiconductor chip 10c. The first semiconductor chip 10c may include a first wafer 10W and a first wiring structure 10MS arranged on the first wafer 10W. The second semiconductor chip 20c may include a second wafer 20W and a second wiring structure 20MS arranged on the second wafer 20W.

The first wafer 10W and the second wafer 20W may be formed based on a Group IV material wafer such as a silicon wafer or a Group III-V compound wafer. The first wafer 10W and the second wafer 20W may include a monocrystalline wafer such as a silicon monocrystalline wafer.

The first wafer 10W and the second wafer 20W are not limited to the monocrystalline wafer, and various wafers such as an epitaxial wafer, a polished wafer, an annealed wafer, and a silicon on insulator (SOI) insulator may be used as the first wafer 10W and the second wafer 20W. An epitaxial wafer is a wafer obtained by growing a crystalline material on a monocrystalline silicon wafer.

The first wafer 10W and the second wafer 20W may each include a well doped with impurities or a structure doped with impurities. The first wafer 10W and the second wafer 20W may include various device isolation structures such as a shallow trench isolation (STI) structure.

Each of the first semiconductor chip 10c and the second semiconductor chip 20c may include various types of individual devices. An individual device may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active element, a passive element, and the like.

In some embodiments, the first semiconductor chip 10c and the second semiconductor chip 20c may each include at least one of a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The main pad structures MP1 and MP2 and the dummy pad structures DP1 and DP2 may be between the first semiconductor chip 10c and the second semiconductor chip 20c. The dummy pad structures DP1 and DP2 may be apart from the main pad structures MP1 and MP2. A first bonding insulating layer 10UI surrounding the first main pad structures MP1 and the first dummy pad structures DP1 may be on the first wiring structure 10MS of the first semiconductor chip 10c. Bottom surfaces of the first bonding insulating layer 10UI, the first main pad structures MP1, and the first dummy pad structures DP1 may contact a first surface of the first semiconductor chip 10c. Bottom surfaces of the first bonding insulating layer 10UI, the first main pad structures MP1, and the first dummy pad structures DP1 may be coplanar with one another, and top surfaces of the first bonding insulating layer 10UI, the first main pad structures MP1, and the first dummy pad structures DP1 may be coplanar with one another.

A second bonding insulating layer 20UI surrounding the second main pad structures MP2 and the second dummy pad structures DP2 may be on the first wiring structures 20MS of the second semiconductor chip 20c. Top surfaces of the second bonding insulating layer 20UI, the second main pad structures MP2, and the second dummy pad structures DP2 may contact a first surface of the second semiconductor chip 20c. Bottom surfaces of the second bonding insulating layer 20UI, the second main pad structures MP2, and the second dummy pad structures DP2 may be coplanar with one another, and top surfaces of the second bonding insulating layer 20UI, the second main pad structures MP2, and the second dummy pad structures DP2 may be coplanar with one another.

The first bonding insulating layer 10UI and the second bonding insulating layer 20UI may be between the first semiconductor chip 10c and the second semiconductor chip 20c. The first bonding insulating layer 10UI may contact the second bonding insulating layer 20UI. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise. As used herein, the term "contact" refers to a direct connection (i.e., touching) unless the context indicates otherwise.

The first bonding insulating layer 10UI and the second bonding insulating layer 20UI each may include a dielectric layer. The first bonding insulating layer 10UI and the second bonding insulating layer 20UI may include $SiO_2$, $SiO_2$ doped with carbon (C-doped $SiO_2$), SiN, silicon carbon nitride (SiCN), polymer, and the like.

The first main pad structures MP1 may be arranged apart from one another by a first pitch P1 in the X direction (the first direction). The first dummy pad structures DP1 may be arranged apart from one another by a third pitch P3 in the X direction (the first direction). The third pitch P3 may be equal to the first pitch P1. In some example embodiments, the first dummy pad structures DP1 may be configured in a polygonal pattern. In other example embodiments, the first dummy pad structures DP1 may be configured in a linear pattern.

Each of the first main pad structures MP1 may have a first width W1 in the X direction (the first direction) that is horizontal to a top surface of the first semiconductor chip 10c. Each of the first dummy pad structures DP1 may have a third width W3 in the X direction (the first direction). Each of the first dummy pad structures DP1 may have a uniform width. For example, for each first dummy pad structure DP1, a top width may be equal to a bottom width. The third width W3 may be substantially equal to the first width W1. The first main pad structures MP1 and the first dummy pad structures DP1 may have a same vertical width (e.g., height) in the Z direction (the third direction).

The second main pad structures MP2 may be apart from one another by a second pitch P2 in the X direction (the first direction). The second dummy pad structures DP2 may be arranged apart from one another by a fourth pitch P4 in the X direction (the first direction). The fourth pitch P4 may be equal to the third pitch P3. In some example embodiments, the second dummy pad structures DP2 may be configured in a polygonal pattern. In other example embodiments, the second dummy pad structures DP2 may be configured in a linear pattern.

Each of the second main pad structures MP3 may have a second width W2 in the X direction (the first direction) that is horizontal to a top surface of the second semiconductor chip 10c. Each of the second dummy pad structures DP2 may have a fourth width W4 in the X direction (the first direction). Each of the second dummy pad structures DP2 may have a uniform width. For example, for each second dummy pad structure DP2, a top width may be equal to a bottom width. The fourth width W4 may be substantially equal to the second width W2. The second main pad structures MP2 and the the second dummy pad structures DP2 may have a same vertical width (e.g., height) in the Z direction (the third direction).

In some embodiments, in a relationship between the first semiconductor chip 10c and the second semiconductor chip 20c, the first pitch P1, the second pitch P2, the third pitch P3, and the fourth pitch P4 may be equal to one another. In some embodiments, in a relationship between the first semiconductor chip 10c and the second semiconductor chip 20c, the first width W1, the second width W2, the third width W3, and the fourth width W4 may be equal to one another.

The first main pad structures MP1 on the first semiconductor chip 10c may be bonded (joined) to the second main pad structures MP2 of the second semiconductor chip 20c. The first dummy pad structures DP1 on the first semiconductor chip 10c are not bonded (not joined) to the second dummy pad structures DP2 on the second semiconductor chip 20c. The first dummy pad structures DP1 on the first semiconductor chip 10c may be bonded (joined) to the second bonding insulating layer 20UI. The second dummy pad structures DP2 on the second semiconductor 20c may be bonded (joined) to the first bonding insulating layer 10UI.

Here, the configurations and bonding (joint) structures of the first semiconductor chip 10c and the second semiconductor 20c will be described in further detail.

First, referring to FIG. 7, a first integrated circuit 10TR may be formed on the first wafer 10W, and a second integrated circuit 20TR may be formed on the second wafer 20W. The first integrated circuit 10TR and the second integrated circuit 20TR may include various semiconductor devices such as a transistor, a diode, a resistor, a capacitor, and the like. FIG. 7 shows a transistor as a representative integrated circuit. The transistor may include, for example, a source/drain region and a channel region formed in the wafer, and a gate structure formed on the wafer.

The first wiring structure 10MS may be arranged on the first wafer 10W, and may include a first wiring layer 14A, a first contact (or a first via contact) 14B, and a first interlayer insulating film 12. The first integrated circuit 10TR may exchange electric signals with the outside through the first wiring layer 14A and the first contact 14B. Here, the electric signal may include a power voltage, a ground voltage, a signal voltage, and the like. The first wiring layer 14A may have a stack structure of a plurality of metal layers respectively arranged at different vertical levels. The first interlayer insulating film 12 may have a stack structure of a plurality of insulating layers and may be arranged to cover the first integrated circuit 10TR.

The second wiring structure 20MS may be arranged on the second wafer 20W, and may include a second wiring layer 24A, a second contact (or a second via contact) 24B, and a second interlayer insulating film 22. The second integrated circuit 20TR may exchange electric signals with the outside through the second wiring layer 24A and the second contact 24B. The second wiring layer 24A may have a stack structure of a plurality of metal layers respectively arranged at different vertical levels. The second interlayer insulating film 22 may have a stack structure of a plurality of insulating layers and may be arranged to cover the second integrated circuit 20TR.

The first interlayer insulating film 12 and the second interlayer insulating film 22 may include at least one of tetraethyl orthosilicate (TEOS), tonen silazene (TOSZ), an atomic layer deposition (ALD) oxide, a flowable chemical vapor deposition (FCVD) oxide, a high density plasma (HDP) oxide, and a plasma enhanced oxidation (PEOX) oxide, but is not limited thereto.

As shown in FIGS. 6A, 6B, and 7, the first main pad structures MP1 may include first main pads 16 arranged apart from one another on the first wiring layer 14A of the first semiconductor chip 10c and first main capping layers 17 on the first main pads 16. The first wiring layer 14A shown in FIG. 6A may be a wiring layer at an uppermost portion of the first semiconductor chip 10c. The first wiring layer 14A may be connected to the first main pad structures MP1.

The first main pads 16 may include a first metal layer 16F and a first barrier layer 16L. The first barrier layer 16L may be between the first metal layer 16F and the first bonding insulating layer 10UL while surrounding a sidewall and a bottom surface of the first metal layer 16F. For example, the first barrier layer 16L may contact bottom and side surfaces of the first metal layer 16F and a side surface of the first main capping layer 17. The first bonding insulating layer 10UL may be arranged to surround sidewalls of the first main pads 16 and the first main capping layers 17.

The second main pad structures MP2 may include second main pads 26 arranged apart from one another on the second wiring layer 24A of the second semiconductor chip 20c and the second main capping layers 27 on the second main pads 26. The second wiring layer 24A shown in FIG. 6A may be a wiring layer in an uppermost portion of the second semiconductor chip 20c.

The second main pads 26 may include a second metal layer 26F and a second barrier layer 26L. The second barrier layer 26L may be between the second metal layer 26F and the second bonding insulating layer 20UL while surrounding sidewalls and a bottom surface of the second metal layer 26F. For example, the second barrier layer 26L may contact bottom and side surfaces of the second metal layer 26F and a side surface of the second main capping layer 27.

The second bonding insulating layer 20UL may be arranged to surround sidewalls of the second main pads 26 and the second main capping layers 27. The first main pads 16 and the second main pads 26 may respectively include different materials from those of the first main capping layers 17 and the second main capping layers 27.

As shown in the first bonding region BD1 of FIG. 6B, the first main capping layers 17 of the first main pad structures MP1 are bonded (joined) to the second main capping layers 27 of the second main pad structures MP2. The first main capping layers 17 and the second main capping layers 27 may be bonded through high-temperature annealing in a state of being in contact with one another.

The first dummy pad structures DP1 may include the first dummy pads 16D arranged apart from one another on the first wiring layer 14A of the first semiconductor chip 10c and the first dummy capping layers 17D on the first dummy pads 16D. The first dummy pads 16D may include a first dummy metal layer 16FD and a first dummy barrier layer 16LD.

The first dummy barrier layer 16LD may be between the first dummy metal layer 16FD and the first bonding insulating layer 10UI while surrounding sidewalls and a bottom surface of the first dummy metal layer 16FD. For example, the first dummy barrier layer 16LD may contact bottom and side surfaces of the first dummy metal layer 16FD and a side surface of the first dummy capping layer 17D. The first bonding insulating layer 10UL may be arranged to surround sidewalls of the first dummy pads 16D and the first dummy capping layers 17D.

The second dummy pad structures DP2 may include the second dummy pads 26D arranged apart from one another on the second wiring layer 24A of the second semiconductor chip 20c and the second dummy capping layers 27D on the second dummy pads 26D. The second dummy pads 26D may include a second dummy metal layer 26FD and a second dummy barrier layer 26LD.

The second dummy barrier layer 26LD may be between the second dummy metal layer 26FD and the second bonding insulating layer 20UI while surrounding sidewalls and a bottom surface of the second dummy metal layer 26FD. For example, the second dummy barrier layer 26LD may contact bottom and side surfaces of the second dummy metal layer 26FD and a side surface of the second dummy capping layer 27D. The second bonding insulating layer 20UI may be arranged to surround sidewalls of the second dummy pads 26D and the second dummy capping layers 27D. The first dummy pads 16D and the second dummy pads 26D may include materials different from those of the first dummy capping layers 17D and second dummy capping layers 27D.

In some embodiments, the first main pad structures MP1 and the first dummy pad structures DP1 may be formed by using a single damascene process. The second main pad structures MP2 and the second dummy pad structures DP2 may be formed by using a single damascene process.

In some embodiments, the first metal layer 16F, the first dummy metal layer 16FD, the second metal layer 26F, and the second dummy metal layer 26FD may each include a metal material, for example, Cu, Al, Ag, Co, Ru, or alloys thereof. In some embodiments, the first barrier layer 16L, the first dummy barrier layer 16LD, the second barrier layer 26L, and the second dummy barrier layer 26LD may each include at least one of Ti, Ta, TiN, and TaN.

The first dummy capping layers 17D of the first dummy pad structures DP1 are not bonded (not joined) to the second dummy capping layers 27D of the second dummy pad structures DP2. As shown in a second bonding region BD2 of FIG. 6B, the first bonding insulating layer 10UI is bonded to the second bonding insulating layer 20UI. The first bonding insulating layer 10UI and the second bonding insulating layer 20UI may be bonded through a high-temperature annealing process in a state of being in contact with each other.

As shown in a third bonding region BD3 of FIG. 6B, the first dummy capping layers 17D of the first dummy pad structures DP1 are bonded (joined) to the second bonding insulating layer 20UI. The first dummy capping layers 17D and the second bonding insulating layers 20UI may be bonded through a high-temperature annealing process in a state of being in contact with each other.

As shown in a fourth bonding region BD4 of FIG. 6B, the second dummy capping layers 27D of the second dummy pad structures DP2 are bonded (joined) to the first bonding insulating layer 10UI. The second dummy capping layers 27D and the first bonding insulating layers 10UI may be bonded through a high-temperature annealing process in a state of being in contact with each other.

In some embodiments, the first main pads 16, the second main pads 26, the first dummy pads 16D, and the second dummy pads 26D may include a metal material, for example, Cu, Al, Ag, Co, Ru, or alloys thereof. The first main capping layers 17, the second main capping layers 27, the first dummy capping layers 17, and the second dummy capping layers 27D may include metal compounds.

In some embodiments, the first main capping layers 17, the second main capping layers 27, the first dummy capping layers 17D, and the second dummy capping layers 27D may include silicon and materials capable of easily forming metal compounds. In some embodiments, the first main capping layers 17, the second main capping layers 27, the first dummy capping layers 17D, and the second dummy capping layers 27D may include manganese, Al, Ti, or alloys thereof.

The semiconductor package 100 described above may improve the bonding reliability by bonding the first capping layers 17 on the first main pads 16 of the first semiconductor chip 10c to the second capping layers 27 on the second main pads 26 of the second semiconductor chip 20c and increasing the bonding strength.

In addition, the semiconductor package 100 may improve the bonding reliability by bonding the first bonding insulating layer 10UI of the first semiconductor chip 10c to the second bonding insulating layer 20UI of the second semiconductor chip 20c and increasing the bonding strength.

In addition, the semiconductor package 100 of the inventive concept may improve the bonding reliability by bonding the first dummy capping layers 17D of the first semiconductor chip 10c to the second bonding insulating layer 20UI and bonding the second dummy capping layers 27D of the second semiconductor chip 20c to the first bonding layer 10UI and increasing the bonding strength.

Figure 8A:
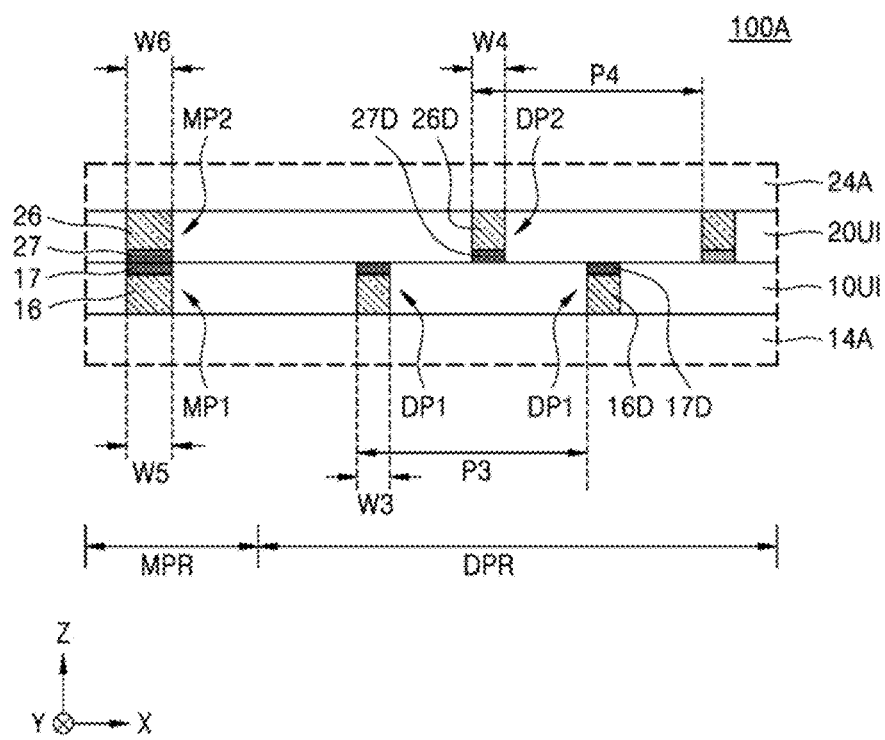
FIGS. 8A and 8B are cross-sectional views of a semiconductor package, according to an example embodiment of the inventive concept.
Figure 8B:
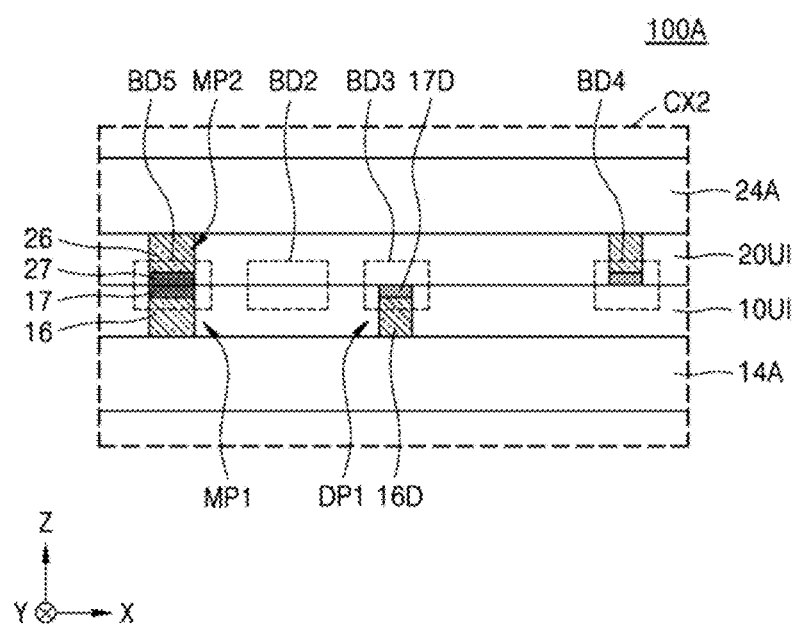

FIGS. 8A and 8B are cross-sectional views of a semiconductor device according to an example embodiment of the inventive concept.

More particularly, a semiconductor package 100A in FIGS. 8A and 8B may be identical to the semiconductor package in FIGS. 6A and 6B except that a fifth width W5 of the first main pad structures MP1 and a sixth width W6 of the second main pad structures MP2 are respectively different from the third width W3 of the first dummy pad structures DP1 and the fourth width W4 of the second dummy pad structures DP2. In FIGS. 8A and 8B, details same as those of FIGS. 6A and 6B will be briefly described or omitted.

Referring to FIG. 8A, each of the first main pad structures MP1 may have a fifth width W5 in the X direction (the first direction) that is horizontal to the top surface of the first semiconductor chip 10c (see FIG. 5). Each of the first dummy pad structures DP1 may have a third width D3 in the X direction (the first direction). The fifth width W5 may be greater than the third width W3. The first main pad structures MP1 and the first dummy pad structures DP1 may have a same vertical width (e.g., height) in the Z direction (the third direction).

Each of the second main pad structures MP2 may have a sixth width W6 in the X direction (the first direction) that is horizontal to the top surface of the second semiconductor chip 20c (see FIG. 5). The sixth width W6 may be equal to the fifth width W5. Each of the second dummy pad structures DP2 may have a fourth width W4 in the X direction (the first direction). The sixth width W6 may be greater than the fourth width W4. The fourth width W4 may be equal to the third width W3. The second main pad structures MP2 and the second dummy pad structures DP2 may have a same vertical width (e.g., height) in the Z direction (the third direction).

Referring to FIG. 8B, in the semiconductor package 100A, the first main pad structures MP1 having the fifth width W5 that is wide are bonded to the second main pad structures MP2 having the sixth width W6 that is wide, as shown in a fifth bonding region BD5. Accordingly, the semiconductor package 100A may improve the bonding reliability by increasing the bonding strength between the first semiconductor chip 10c (see FIG. 5) and the second semiconductor chip 20c (see FIG. 5).

Although FIGS. 8A and 8B illustrate that widths of the first main pad structures MP1 and the second main pad structures MP2 are greater than widths of the first dummy pad structures DP1 and the second dummy pad structures DP2, on other embodiments, the widths of the first main pad structures MP1 and the second main pad structures MP2 may be less than the widths of the first dummy pad structures DP1 and the second dummy pad structures DP2.

Figure 9A:
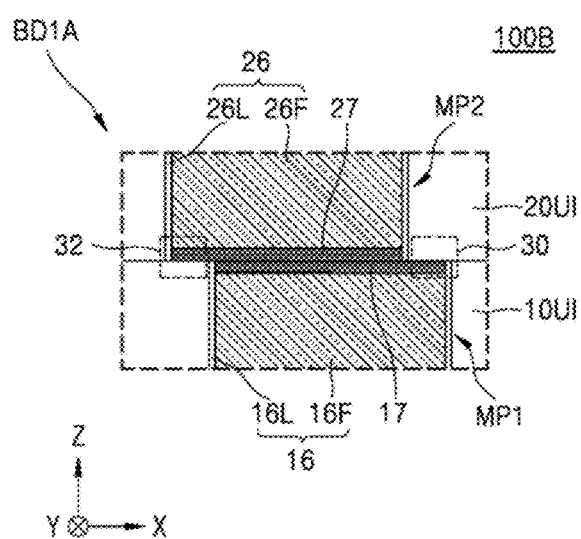
FIGS. 9A and 9B are cross-sectional views of a semiconductor package, according to an example embodiment of the inventive concept.
Figure 9B:
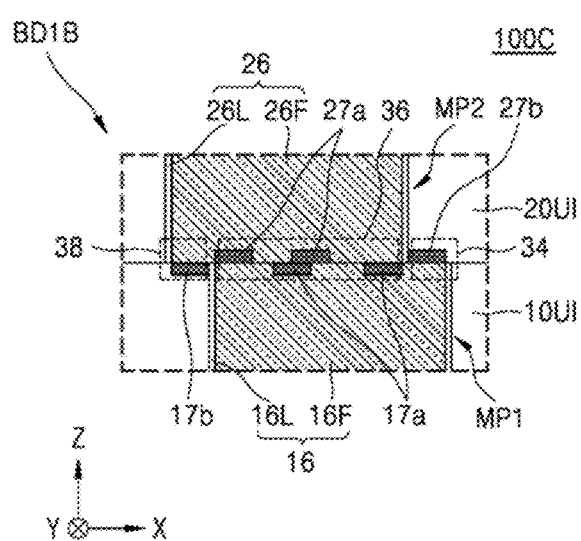

FIGS. 9A and 9B are cross-sectional views of a semiconductor package according to an embodiment of the inventive concept.

More particularly, semiconductor packages 100B and 100C in FIGS. 9A and 9B may be identical to the semiconductor package 100 of FIGS. 6A, 6B, and 7 except that first bonding regions BD1A and BD1B in FIGS. 9A and 9B are different from the first bonding region BD1 of the semiconductor package 100 shown in FIGS. 6A, 6B, and 7. In FIGS. 9A and 9B, details same as those of FIGS. 6A, 6B, and 7 will be briefly described or omitted.

Referring to FIG. 9A, the first main pad structures MP1 do not completely overlap with the second main pad structures MP2 in the Z direction (the third direction) in the first bonding region BD1A. Accordingly, portions of the first capping layers 17 of the first main pad structures MP1 are bonded to the second bonding insulating layer 20UI as marked with reference numeral 30. Portions of the second capping layers 27 of the second main pad structures MP2 are bonded to the first bonding insulating layer 10UI as marked with reference numeral 32.

In the semiconductor package 100B, the bonding strength between the first semiconductor chip 10c (see FIG. 5) and the second semiconductor chip 20c (see FIG. 5) are maintained even when the first capping layers 17 of the first main pad structures MP1 are bonded to the second bonding insulating layer 20UI and the second capping layers 27 of the second main pad structures MP2 are bonded to the first bonding insulating layer 10UI, and therefore, the bonding reliability may be improved.

Referring to FIG. 9B, like in the first bonding region BD1A, the first main pad structures MP1 do not completely overlap with the second main pad structures MP2 in the Z direction (the third direction) in the first bonding region BD1B. The first capping layers 17a and 17b of the first main pad structures MP1 are not continuously arranged and separate from each other in the X direction (the first direction). The first capping layers 17a and 17b may include metal compounds. The second capping layers 27a and 27b are not continuously arranged and separated from each other in the X direction (the first direction). The second capping layers 27a and 27b may include metal compounds.

Accordingly, the first capping layers 17a of the first main pad structures MP1 are bonded to the second main pads 26 or the second capping layers 27a of the second main pad structures MP2 as marked with reference numeral 36. The first capping layers 17b of the first main pad structures MP1 are bonded to the second main pads 26 of the second main pad structures MP2 as marked with reference numeral 38.

The second capping layers 27a of the second main pad structures MP2 are bonded to the first main pads 16 or the first capping layers 17a of the first main pad structures MP1 as marked with reference numeral 36. The second capping layers 27b of the second main pad structures MP2 are bonded to the first main pads 16 of the first main pad structures MP1 as marked with reference numeral 34.

As described above, in the semiconductor package 100C, even when the first capping layers 17a and 17b of the first main pad structures MP1 are bonded to the second main pads 26 or the second capping layers 27a of the second main pad structures MP2 and the second capping layers 72a of the second main pad structures MP2 are bonded to the first main pads 16 or the first capping layers 17a of the first main pad structures MP1, the bonding strength between the first semiconductor chip 10c (see FIG. 5) and the second semiconductor chip 20c (see FIG. 5) may be maintained, and therefore, the bonding reliability may be improved.

Figure 10:
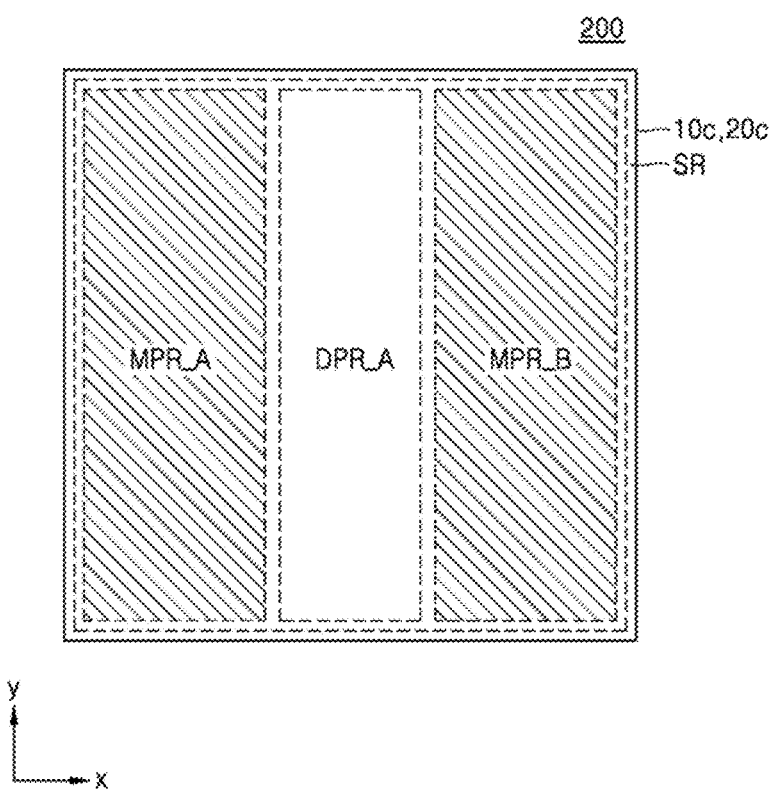
FIG. 10 is a top-plan view of a semiconductor package, according to an example embodiment of the inventive concept.
Figure 11:
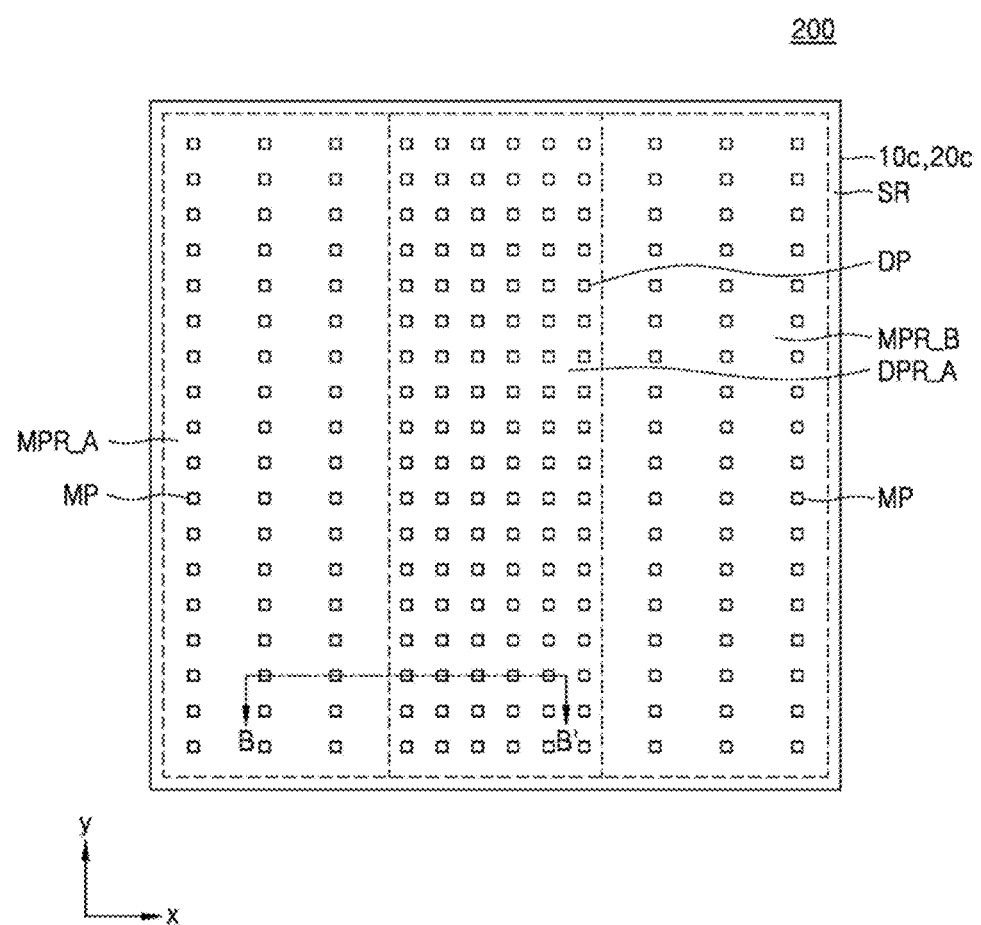
FIG. 11 is a top-plan view of a pad arrangement of the semiconductor package shown in FIG. 10.
Figure 12:
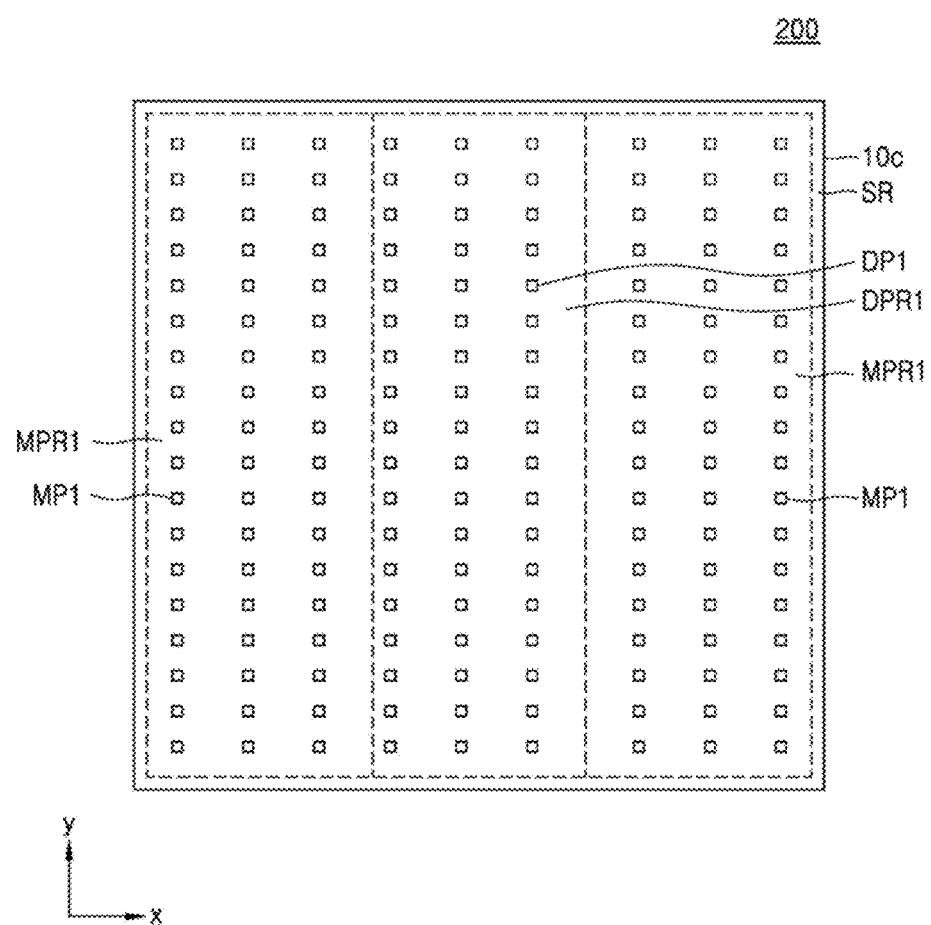
FIGS. 12 and 13 are top-plan views respectively showing pad arrangements of a first semiconductor chip shown in FIG. 10 and a second semiconductor chip shown in FIG. 11.
Figure 13:
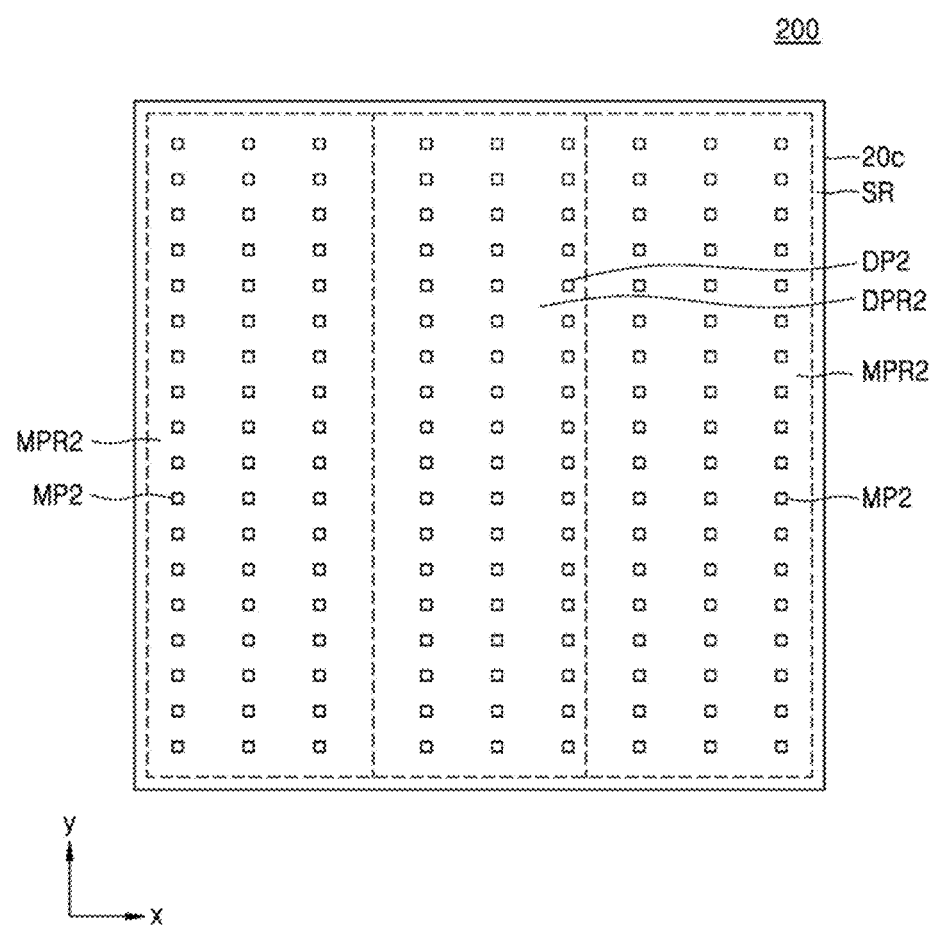

FIG. 10 is a top-plan view of a semiconductor package according to an example embodiment of the inventive concept, FIG. 11 is a top-plan view of a pad arrangement of the semiconductor package shown in FIG. 10, and FIGS. 12 and 13 are top-plan views respectively showing pad arrangements of a first semiconductor chip and a second semiconductor chip shown in FIGS. 10 and 11.

More particularly, the semiconductor package 200 described with reference to FIGS. 10 through 13 may be equal to the semiconductor package shown in FIGS. 1 through 4 except that an arrangement of main pad regions MPR_A and MPR_B and dummy pad region DPR_A is different from that of the semiconductor package shown in FIGS. 1 through 4. In FIGS. 10 through 13, details same as those of FIGS. 1 through 4 will be briefly described or omitted.

As shown in FIGS. 10 and 11, the semiconductor package 200 may have a structure in which the first semiconductor chip 10c and the second semiconductor chip 20c are bonded (joined) to each other. The semiconductor package 200 may have a structure in which the second semiconductor chip 20c is stacked and bonded (joined) on the first semiconductor chip 10c.

In the first semiconductor chip 10c and the second semiconductor chip 20c, a left main pad region MPR_A and a right main pad region MPR_B may be arranged respectively in a left region and a right region, and a middle dummy pad region DPR_A may be in a middle region between the left main pad region MPR_A and the right main pad region MPR_B. In the first semiconductor chip 10c and the second semiconductor chip 20c, a scribe line region SR may be arranged in an edge region. The scribe line region SR may surround the left main pad region MPR_A, the right main pad region MPR_B, and the middle dummy pad region DPR_A.

Main pad structures MP apart from one another may be arranged in the left main pad region MPR_A and the right main pad region MPR_B. The main pad structures MP may be referred to as bonding pad structures. The main pad structures MP may be structures electrically connecting the first semiconductor chip 10c to the second semiconductor chip 20c.

The dummy pad structures DP placed apart from one another may be arranged in the middle dummy pad region DPR_A. The dummy pad structures DP may be structures that do not electrically connect the first semiconductor chip 10c to the second semiconductor chip 20c. The dummy pad structures DP may be provided to adjust pad densities between left and right main pad regions MPR_A and MPR_B and the middle dummy pad region DPR_A.

As shown in FIG. 12, the first semiconductor chip 10c may include the first main pad region MPR1 constructing the left main pad region MPR_A and the right main pad region MPR_B. The first main pad structures MP1 apart from one another may be arranged in the first main pad region MPR1. The first main pad structures MP1 may be referred to as first bonding pad structures.

The first semiconductor chip 10c may include the first dummy pad region DPR1 constructing the middle dummy pad region DPR_A. The first dummy pad structures DP1 placed apart from one another may be arranged in the first dummy pad region DPR1. The first dummy pad structures DP1 may be provided to adjust the pad density between the first main pad region MPR1 and the first dummy pad region DPR1.

As shown in FIG. 13, the second semiconductor chip 20c may include the second main pad region MPR2 constructing the left main pad region MPR_A and the right main pad region MPR_B. The second main pad structures MP2 placed apart from one another may be arranged in the second main pad region MPR2. The second main pad structures MP2 may be referred to as second bonding pad structures. The second main pad structures MP2 may be bonded (joined) to the first main structures MP1 of the first semiconductor chip 10c.

The second semiconductor chip 20c may include the second dummy pad region DPR2 constructing the middle dummy pad region DPR_A. The second dummy pad structures DP2 placed apart from one another may be arranged in the second dummy pad region DPR2. The second dummy pad structures DP2 may not be bonded (not joined) to the first dummy pad structures DP1 of the first semiconductor chip 10c.

In some embodiments, compared to the first dummy pad structures DP1, the second dummy pad structures DP2 may be arranged to be shifted in the X direction. The second dummy pad structures DP2 may be provided to adjust pad densities between the second main pad region MPR2 and the second dummy pad region DPR2.

Figure 14:
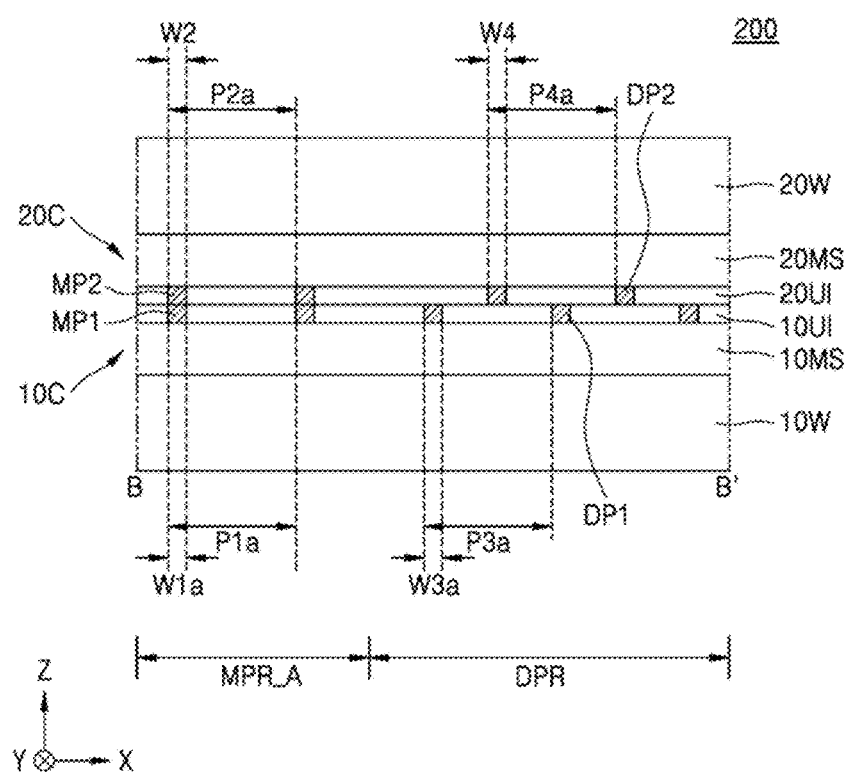
FIG. 14 is a cross-sectional view taken along line B-B' shown in FIG. 11.

FIG. 14 is a cross-sectional view taken along line B1-B' of FIG. 11.

In detail, FIG. 14 may be a drawing corresponding to FIG. 5. In FIG. 14, details same as those of FIG. 5 will be briefly described or omitted. The semiconductor package 200 may include the second semiconductor chip 20c arranged (or bonded) on the first semiconductor chip 10c.

The first semiconductor chip 10c may include a first wafer 10W and a first wiring structure 10MS arranged on the first wafer 10W. The second semiconductor chip 20c may include a second wafer 20W and a second wiring structure 20MS arranged on the second wafer 20W.

The first main pad structures MP1 may be arranged apart from one another by a first pitch P1a in the X direction (the first direction). The first dummy pad structures DP1 may be arranged apart from one another by a third pitch P3a in the X direction (the first direction). The third pitch P3a may be equal to the first pitch P1a.

Each of the first main pad structures MP1 may have a first width W1a in the X direction (the first direction) that is horizontal to the top surface of the first semiconductor chip 10c. Each of the first dummy pad structures DP1 may have a third width W3a in the X direction (the first direction). The third width W3a may be substantially equal to the first width W1a. The first main pad structures MP1 and the first dummy pad structures DP1 may have a same vertical width (e.g., height) in the Z direction (the third direction).

The second main pad structures MP2 may be arranged apart from one another by a second pitch P2a in the X direction (the first direction). The second dummy pad structures DP2 may be arranged apart from one another by a fourth pitch P4a in the X direction (the first direction). The fourth pitch P4a may be equal to the third pitch P3a.

Each of the second main pad structures MP2 may have a second width W2a in the X direction (the first direction) that is horizontal to the top surface of the second semiconductor chip 20c. Each of the second dummy pad structures DP2 may have a fourth width W4a in the X direction (the first direction). The fourth width W4a may be substantially equal to the second width W2a. The second main pad structures MP2 and the the second dummy pad structures DP2 may have a same vertical width (e.g., height) in the Z direction (the third direction).

In some embodiments, in a relationship between the first semiconductor chip 10c and the second semiconductor chip 20c, the first pitch P1a, the second pitch P2a, the third pitch P3a, and the fourth pitch P4a may be equal to one another. In some embodiments, in a relationship between the first semiconductor chip 10c and the second semiconductor chip 20c, the first width W1a, the second width W2a, the third width W3a, and the fourth width W4a may be equal to one another.

Figure 15:
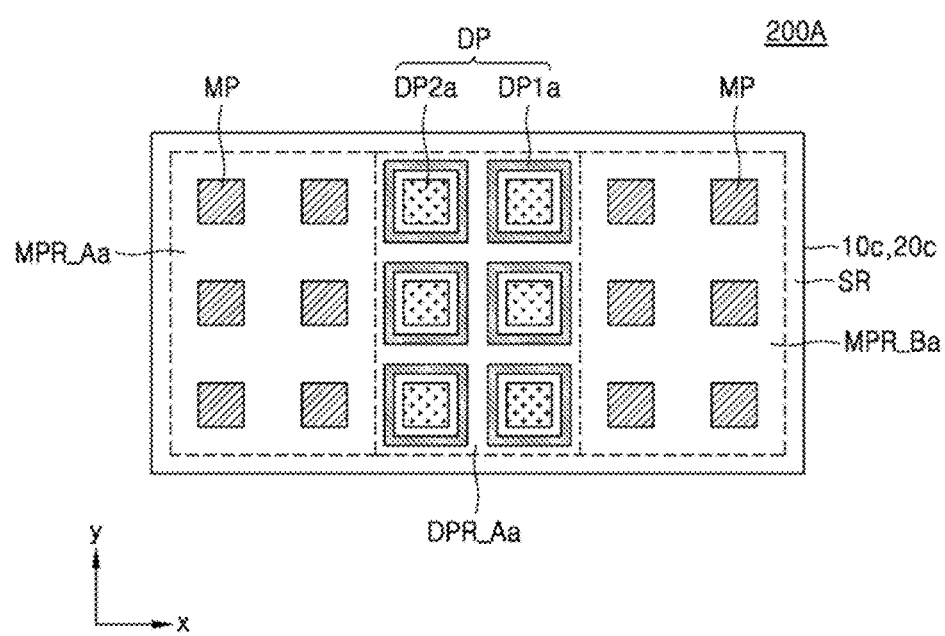
FIG. 15 is a top-plan view of a pad arrangement of a semiconductor package, according to an example embodiment of the inventive concept.
Figure 16:
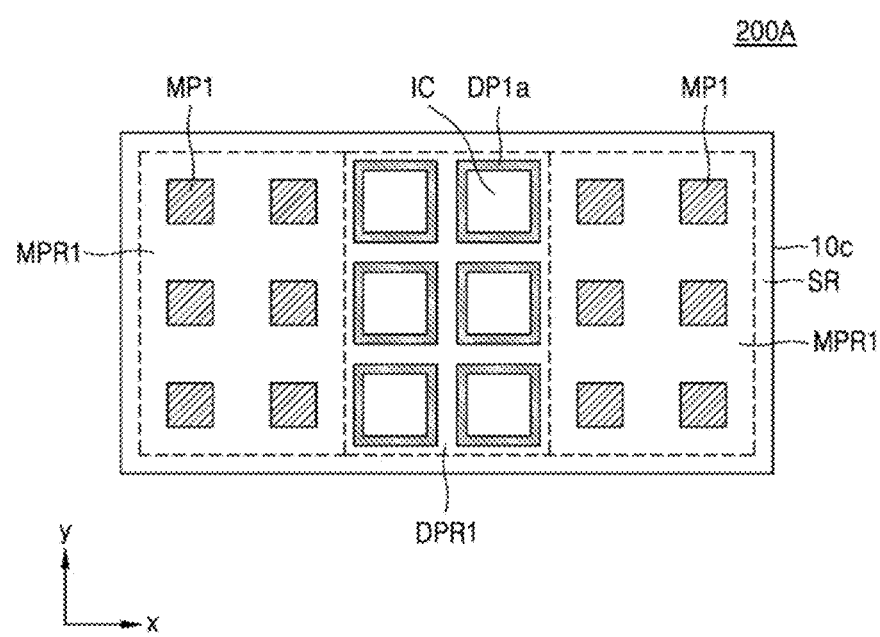
FIGS. 16 and 17 are top-plan views respectively showing pad arrangements of a first semiconductor chip and a second semiconductor chip shown in FIG. 15.
Figure 17:
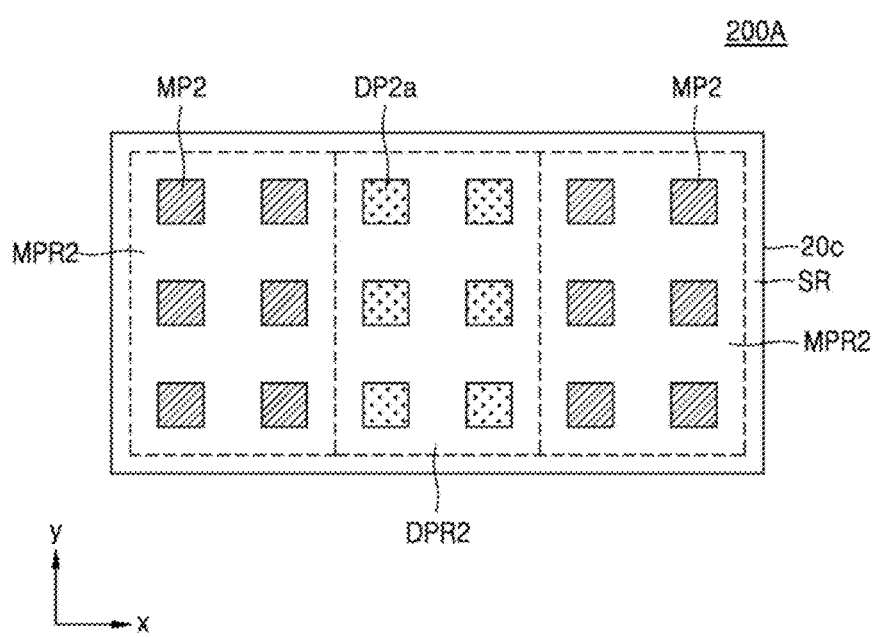

FIG. 15 is a top-plan view of a pad arrangement of a semiconductor package according to an example embodiment of the inventive concept, and FIGS. 16 and 17 are top-plan views showing pad arrangements of a first semiconductor chip and a second semiconductor chip shown in FIG. 15.

More particularly, a semiconductor package 200A described with reference to the semiconductor package 200 shown in FIGS. 10 through 13 except that shapes of main pad regions MPR_Aa and MPR_Ba and dummy pad region DPR_Aa are different from those of the semiconductor package 200 shown in FIGS. 10 through 13. In FIGS. 15 through 17, details same as those of FIGS. 10 through 13 will be briefly described or omitted.

As shown in FIG. 15, the semiconductor package 200A may have a structure in which the first semiconductor chip 10c and the second semiconductor chip 20c are bonded (joined) to each other. The semiconductor package 200A may have a structure in which the second semiconductor chip 20c is stacked on and bonded (joined) to the first semiconductor chip 10c.

In the first semiconductor chip 10c and the second semiconductor chip 20c, a left main pad region MPR_Aa and a right main pad region MPR_Ba are respectively arranged in a left region and a right region, and a middle dummy pad region DPR_Aa may be in a middle region between the left main pad region MPR_Aa and the right main pad region MPR_Ba. In the first semiconductor chip 10c and the second semiconductor chip 20c, a scribe line region SR may be arranged in an edge region. For example, the scribe line region SR may surround the left main pad region MPR_Aa, the right main pad region MPR_Ba, and the middle dummy pad region DPR_Aa.

Main pad structures MP placed apart from one another may be arranged in the left main pad region MPR_Aa and the right main pad region MPR_Ba. The main pad structures MP may be referred to as bonding pad structures. The main pad structures MP may be structures electrically connecting the first semiconductor chip 10c to the second semiconductor chip 20c.

Dummy pad structures DP placed apart from one another may be arranged in the middle dummy pad region DPR_Aa. The dummy pad structures DP that do not electrically connect the first semiconductor chip 10c to the second semiconductor chip 20c.

The dummy pad structures DP may include first dummy pad structures DP1a and second dummy pad structures DP2a. The first dummy pad structures DP1a may have a shape different from that of the second dummy pad structures DP2a. The second dummy pad structures DP2a may be arranged in the first dummy pad structures DP1a.

The first dummy pad structures DP1a may not overlap with the second dummy pad structures DP2a in a plan view. The dummy pad structures DP may be provided to adjust pad densities between left and right main pad regions MPR_Aa and MPR_Ba and the middle dummy pad region DPR_Aa.

As shown in FIG. 16, the first semiconductor chip 10c may include the first main pad region MPR1 constructing the left main pad region MPR_Aa and the right main pad region MPR_Ba. The first main pad structures MP1 placed apart from one another may be arranged in the first main pad region MPR1. The first main pad structures MP1 may be referred to as first bonding pad structures.

The first semiconductor chip 10c may include the first dummy pad region DPR1 constructing the middle dummy pad region DPR_Aa. The first dummy pad structures DP1a placed apart from one another may be arranged in the first dummy pad region DPR1. Each of the first dummy pad structures DP1a may be configured in a hollow pattern having an inner room IC in a plan view. The first dummy pad structures DP1a may be provided to adjust the pad density between the first main pad region MPR1 and the first dummy pad region DPR1.

As shown in FIG. 17, the second semiconductor chip 20c may include the second main pad region MPR2 constructing the left main pad region MPR_Aa and the right main pad region MPR_Ba. The second main pad structures MP2 placed apart from one another may be arranged in the second main pad region MPR2. The second main pad structures MP2 may be referred to as second bonding pad structures. The second main pad structures MP2 may be bonded (joined) to the first main structures MP1 of the first semiconductor chip 10c.

The second semiconductor chip 20c may include the second dummy pad region DPR2 constructing the middle dummy pad region DPR_Aa. The second dummy pad structures DP2 placed apart from one another may be arranged in the second dummy pad region DPR2.

In a plan view, the second dummy pad structures DP2a may be stuffed solid patterns in the inner rooms IC of the hollow patterns included in the first dummy pad structures DP1a. The second dummy pad structures DP2a may be not bonded (not joined) from the first dummy pad structures DP1a of the first semiconductor chip 10c. The second dummy pad structures DP2a may be provided to adjust the pad intensity between the second main pad region MPR2 and the second dummy pad region DPR2.

Figure 18:
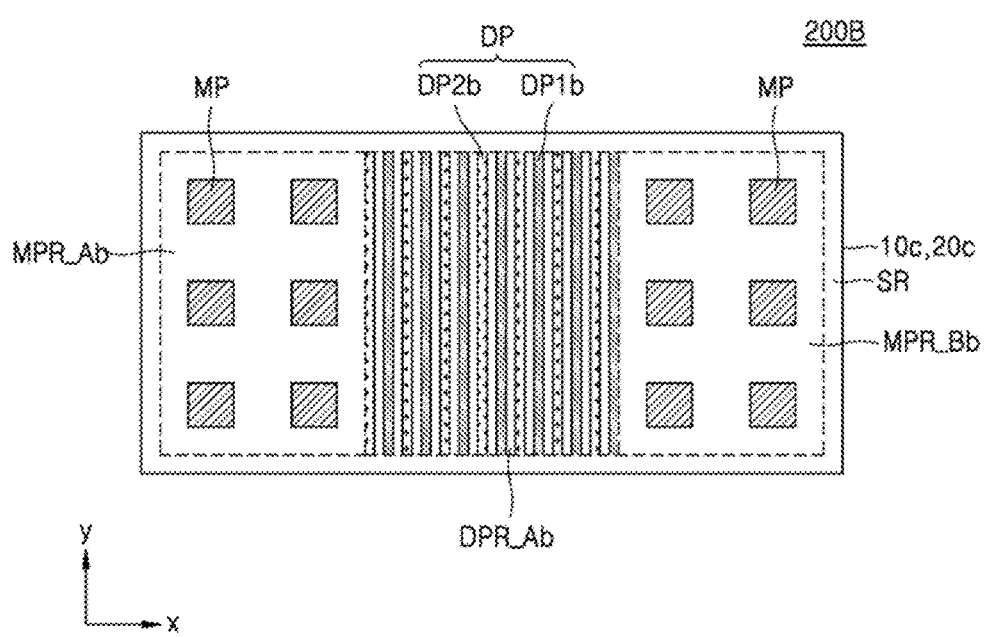
FIG. 18 is a top-plan view of a pad arrangement of a semiconductor package, according to an example embodiment of the inventive concept.
Figure 19:
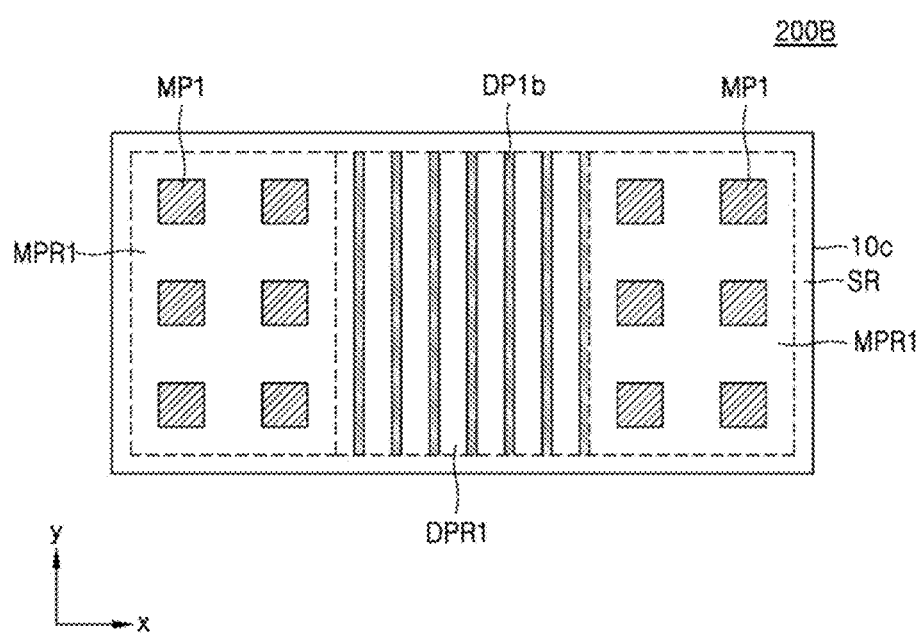
FIGS. 19 and 20 are top-plan views respectively showing pad arrangements of a first semiconductor chip and a second semiconductor chip shown in FIG. 18.
Figure 20:
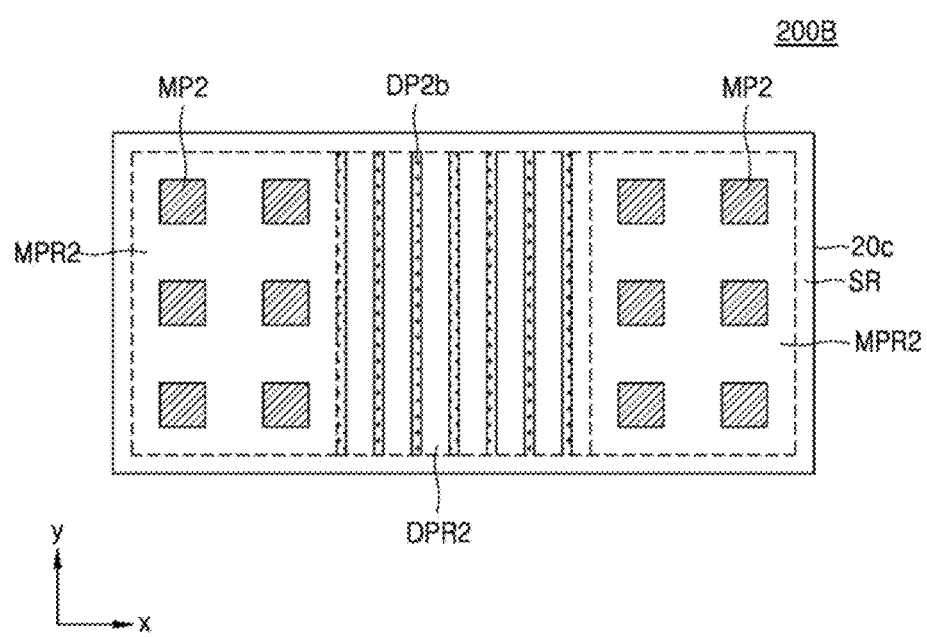

FIG. 18 is a top-plan view of a pad arrangement of a semiconductor package according to an example embodiment of the inventive concept, and FIGS. 19 and 20 are top-plan views respectively showing pad arrangements of a first semiconductor chip and a second semiconductor chip shown in FIG. 18.

More particularly, a semiconductor package 200B described with reference to FIGS. 18 through 20 may be different from the semiconductor package 200 shown in FIGS. 10 through 13 except that shapes of main pad regions MPR_Ab and MPR_Bb and dummy pad region DPR_Ab are different from those of the semiconductor package 200 shown in FIGS. 10 through 13. In FIGS. 18 through 20, details same as those of FIGS. 10 through 13 will be briefly described or omitted.

As shown in FIG. 18, the semiconductor package 200B may have a structure in which the first semiconductor chip 10c and the second semiconductor chip 20c are bonded (joined) to each other. The semiconductor package 200B may have a structure in which the second semiconductor chip 20c is stacked on and bonded (joined) to the first semiconductor chip 10c.

In the first semiconductor chip 10c and the second semiconductor chip 20c, a left main pad region MPR_Ab and a right main pad region MPR_Bb are respectively arranged in a left region and a right region, and a middle dummy pad region DPR_Ab may be in a middle region between the left main pad region MPR_Ab and the right main pad region MPR_Bb. In the first semiconductor chip 10c and the second semiconductor chip 20c, a scribe line region SR may be arranged in an edge region. The scribe line region SR may surround the left main pad region MPR_Ab, the right main pad region MPR_Bb, and a middle dummy pad region DPR_Ab.

The main pad structures MP placed apart from one another may be arranged in the left main pad region MPR_Ab and the right main pad region MPR_Bb. The main pad structures MP may be referred to as bonding pad structures. The main pad structures MP may be structures electrically connecting the first semiconductor chip 10c to the second semiconductor chip 20c.

The dummy pad structures being placed apart from one another may be arranged in the middle dummy pad region DPR_Ab. The dummy pad structures DP that do not electrically connect the first semiconductor chip 10c to the second semiconductor chip 20c.

The dummy pad structures DP may include first dummy pad structures DP1b and second dummy pad structures DP2b. The first dummy pad structures DP1b and the second dummy pad structures DP2b may be alternatively arranged in the X direction. The second dummy pad structures DP2b may be arranged between the first dummy pad structures DP1b.

The first dummy pad structures DP1b may not overlap with the second dummy pad structures DP2b in a plan view. The dummy pad structures may be provided to adjust pad densities between left and right main pad regions MPR_Ab and MPR_Bb and the middle dummy pad region DPR_Ab.

As shown in FIG. 19, the first semiconductor chip 10c may include a first main pad region MPR1 constructing the left main pad region MPR_Ab and right main pad region MPR_Bb. The first main pad structures MP1 placed apart from one another may be arranged in the first main pad region MPR1. The first main pad structures MP1 may be referred to as first bonding pad structures.

The first semiconductor chip 10c may include the first dummy pad region DPR1 constructing the middle dummy pad region DPR_Ab. First dummy pad structures DP1b placed apart from one another may be arranged in the first dummy pad region DPR1. Each of the first dummy pad structures DP1b may be linear patterns extending in the Y direction in a plan view. The first dummy pad structures DP1b may be provided to adjust the pad intensity between the first main pad region MPR1 and the first dummy pad region DPR1.

As shown in FIG. 20, the second semiconductor chip 20c may include second main pads MPR2 constructing the left main pad region MPR_Ab and right main pad region MPR_Bb. The second main pad structures MP2 placed apart from one another may be arranged in the second main pad region MPR2. The second main pad structures MP2 may be referred to as second bonding pad structures. The second main pad structures MP2 may be bonded (joined) to the first main structures MP1 of the first semiconductor chip 10c.

The second semiconductor chip 20c may include the second dummy pad region DPR2 constructing the middle dummy pad region DPR_Ab. The second dummy pad structures DP2b being placed apart from one another may be arranged in the second dummy pad region DPR2.

The second dummy pad structures DP2b may be linear patterns extending in the Y direction in a plan view. The second dummy pad structures DP2b may not be bonded (not joined) to the first dummy pad structures DP1b of the first semiconductor chip 10c. The second dummy pad structures DP2b may be provided to adjust a pad density between the second main pad region MPR2 and the second dummy pad region DPR2.

Figure 21:
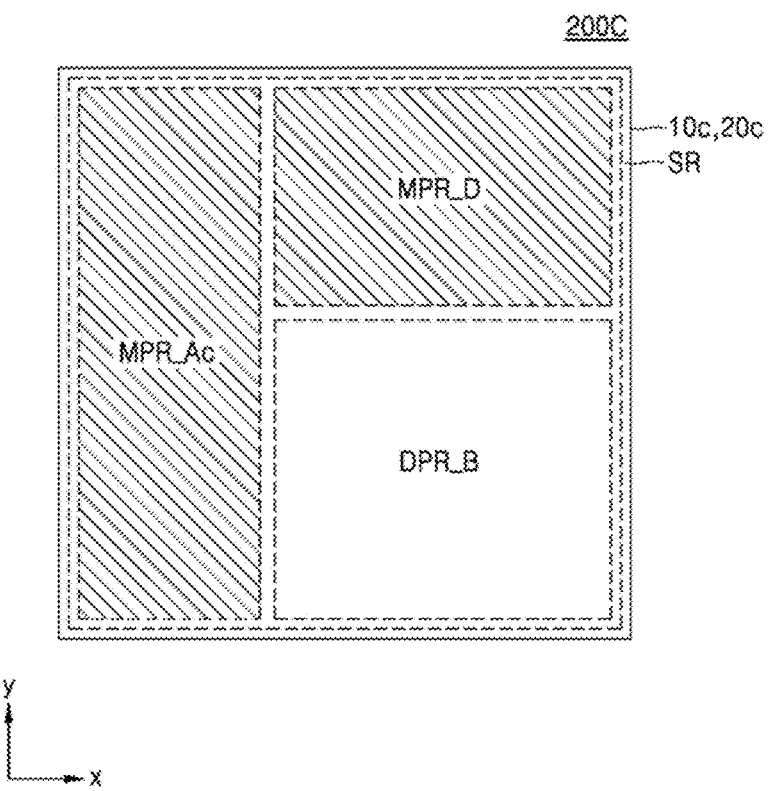
FIG. 21 is a top-plan view of a pad arrangement of a semiconductor package, according to an example embodiment of the inventive concept.

FIG. 21 is a top-plan view of a pad arrangement of a semiconductor package according to an example embodiment of the inventive concept.

More particularly, a semiconductor package 200C described with reference to FIG. 21 may be identical to the semiconductor package 200 shown in FIGS. 10 through 13 except that arrangements of main pad regions MPR_Ac and MPR_D and dummy pad region DPR_B. In FIG. 21, details same as those of FIGS. 10 through 13 will be briefly described or omitted.

As shown in FIG. 21, the semiconductor package 200C may have a structure in which the first semiconductor chip 10c and the second semiconductor chip 20c are bonded (joined) to each other. The second semiconductor 200C may have a structure in which the second semiconductor chip 20c is stacked on and bonded (joined) to the first semiconductor chip 10c.

In the first semiconductor chip 10c and the second semiconductor chip 20c, a left main pad region MPR_Ac is arranged in a left region, a top main pad region MPR_D is arranged in a top region, and a bottom dummy pad region DPR_B may be on the right of the left main pad region MPR_A and below the top main pad region MPR_D. In the first semiconductor chip 10c and the second semiconductor chip 20c, a scribe line region SR may be arranged in an edge region.

As described above, the main pad structures MP may be arranged in the left main pad region MPR_Ac and the top main pad region MPR_D, and the dummy pad structures DP may be arranged in the bottom dummy pad region DPR_B. As described above, main pad regions MPR_Ac and MPR_D and the dummy pad region DPR_B may be arranged in various shapes in the semiconductor package 200C.

Figure 22:
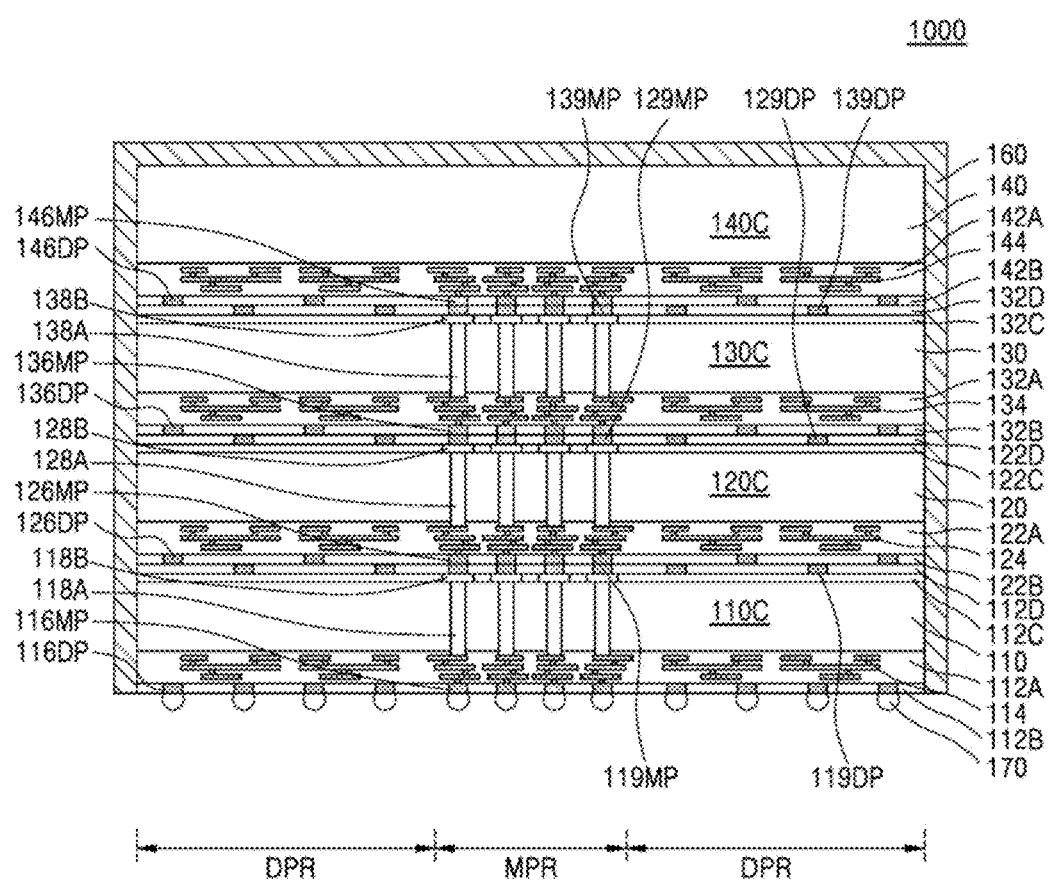
FIG. 22 is a cross-sectional view of a semiconductor package, according to an example embodiment of the inventive concept.

FIG. 22 is a cross-sectional view of a semiconductor package according to an example embodiment of the inventive concept.

In detail, a semiconductor package 1000 may include a first semiconductor chip 110C, a second semiconductor chip 120C, a third semiconductor chip 130C, and a fourth semiconductor chip 140C. The first semiconductor chip 110C may include a wiring layer 114 and an interlayer insulating layer 112A arranged on a first surface of the first wafer 110, and a bonding insulating layer 112B, a main pad 116MP, and a dummy pad 116DP may be arranged on the interlayer insulating layer 112A. A top insulating layer 112C, a bonding insulating layer 112D, a main pad 119MP, and a dummy pad 119DP may be arranged on a second surface of the first wafer 110.

Likewise, the second through fourth semiconductor chips 120C, 130C, and 140C may include wiring layers 124, 134, and 144 and interlayer insulating films 122A, 132A, and 142A arranged on first surfaces of second through fourth wafers 120, 130, and 140, respectively, and bonding insulating layers 122B, 132B, and 142B, main pads 126MP, 136MP, and 146MP, and dummy pads 126DP, 136DP, and 146DP may be arranged on the interlayer insulating films 122A, 132A, and 142A. Top insulating layers 122C and 132C, bonding insulating layers 122D and 132D, main pads 129MP and 139MP, and dummy pads 129DP and 139DP may be arranged on second surfaces of the second wafer 120 and third wafer 130, respectively.

The first semiconductor chip 110C may further include a penetrating via 118A penetrating the first substrate 110, and an upper wiring layer 118B and a main pad 119MP connecting the penetrating via 118A to the main pad 126MP. Likewise, the second semiconductor chip 120C and third semiconductor chip 130C may respectively further include penetrating vias 128A and 138A penetrating the second substrate 120 and third substrate 130, upper wiring layers 128B and 138B and main pads 129MP and 139MP arranged on second surfaces of the second substrate 120 and third substrate 130 and connecting the penetrating vias 128A and 138A to the main pads 136MP and 146MP.

The dummy pad 119DP of the first semiconductor chip 110C is not in contact with the dummy pad 126DP of the second semiconductor chip 120C. The dummy pad 129DP of the second semiconductor chip 120C is not in contact with the dummy pad 136DP of the third semiconductor chip 130C. The dummy pad 139DP of the third semiconductor chip 130C is not in contact with the dummy pad 146DP of the fourth semiconductor chip 140C.

A molding member 160 surrounding top surfaces and lateral surfaces of the first through fourth semiconductor chips 110C, 120C, 130C, and 140C may be further arranged, and a connection bump 170 may be attached to the main pad 116MP and the dummy pad 116DP arranged on the first surface of the first semiconductor chip 110C. The molding member 160 may include an epoxy mold compound (EMC) and the like, however, in some embodiments, the molding member 160 may only cover the lateral surfaces of the first through fourth semiconductor chips 110C, 120C, 130C, and 140C, or may be omitted.

In example embodiments, the first through fourth semiconductor chips 110C, 120C, 130C, and 140C may be memory chips or logic chips. For example, all of the first through fourth semiconductor chips 110C, 120C, 130C, and 140C may be a same kind of memory chips, or at least one of the first through fourth semiconductor chips 110C, 120C, 130C, and 140C may be logic chip and others may be memory chips.

Figure 23:
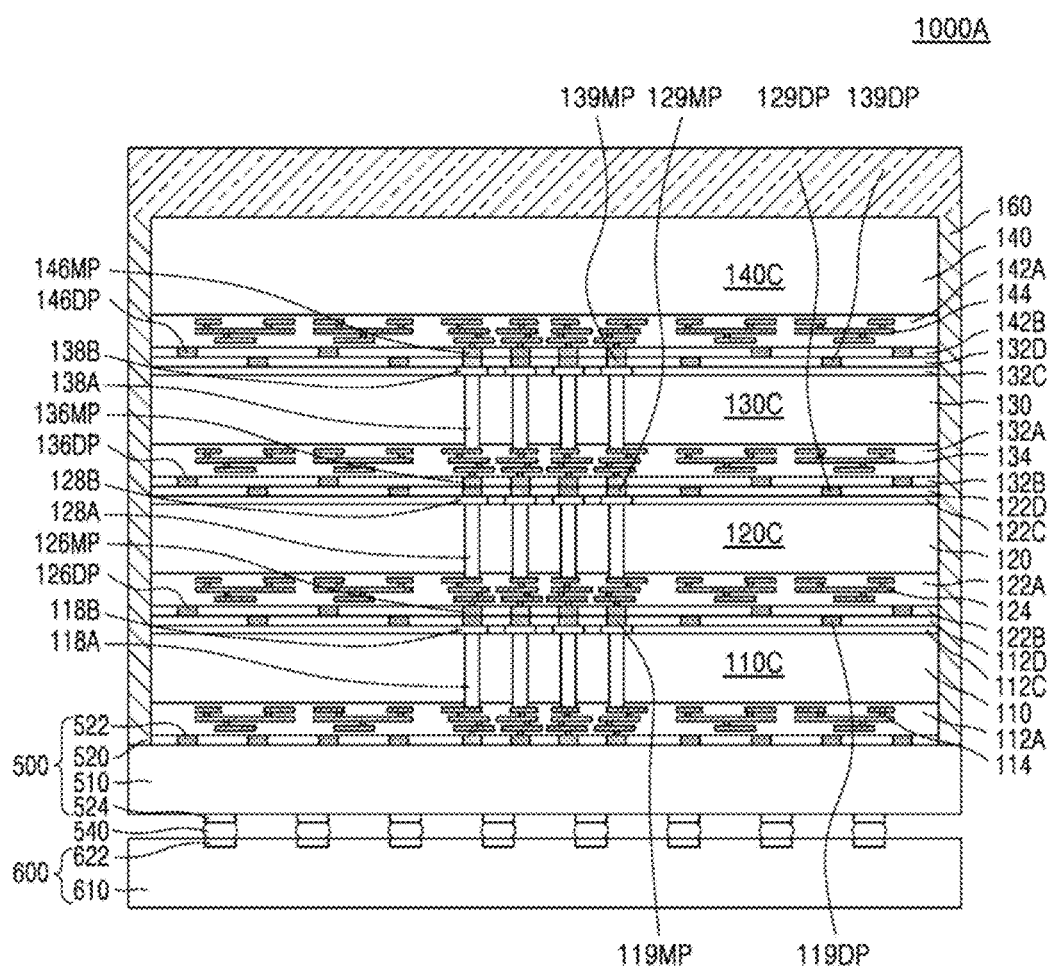
FIG. 23 is a cross-sectional view of a semiconductor package, according to an example embodiment of the inventive concept.

FIG. 23 is a cross-sectional view of a semiconductor package according to an example embodiment of the inventive concept.

More particularly, a semiconductor package 1000A in FIG. 23 may be identical to the semiconductor package in FIG. 22 except that a semiconductor package 1000A may further include an interposer 500. In FIG. 23, details same as those of FIG. 22 will be briefly described or omitted. The interposer 500 may include a base layer 510, a re-wiring layer 520, a first top surface pad 522, and a first bottom surface pad 524. A penetrating via (not shown) electrically connecting the first top surface pad 522 to the first bottom surface pad 524 may be further arranged in the base layer 510. The interposer 500 and the first semiconductor chip 110C may be attached to each other through metal-oxide hybrid bonding by using the first top surface pad 522. Alternatively, the interposer 500 and the first semiconductor chip 110C may be connected to each other through a connection bump (not shown).

A main board 600 may include a base board layer 610 and a second top surface pad 622, and the first bottom surface pad 524 of the interposer 500 may be electrically connected to a second top surface pad 622 of the main board 600 by a board connection terminal 540. A heat-radiating or spreading unit (not shown) may be further arranged above the fourth semiconductor chip 140C and the molding member 160.

Figure 24:
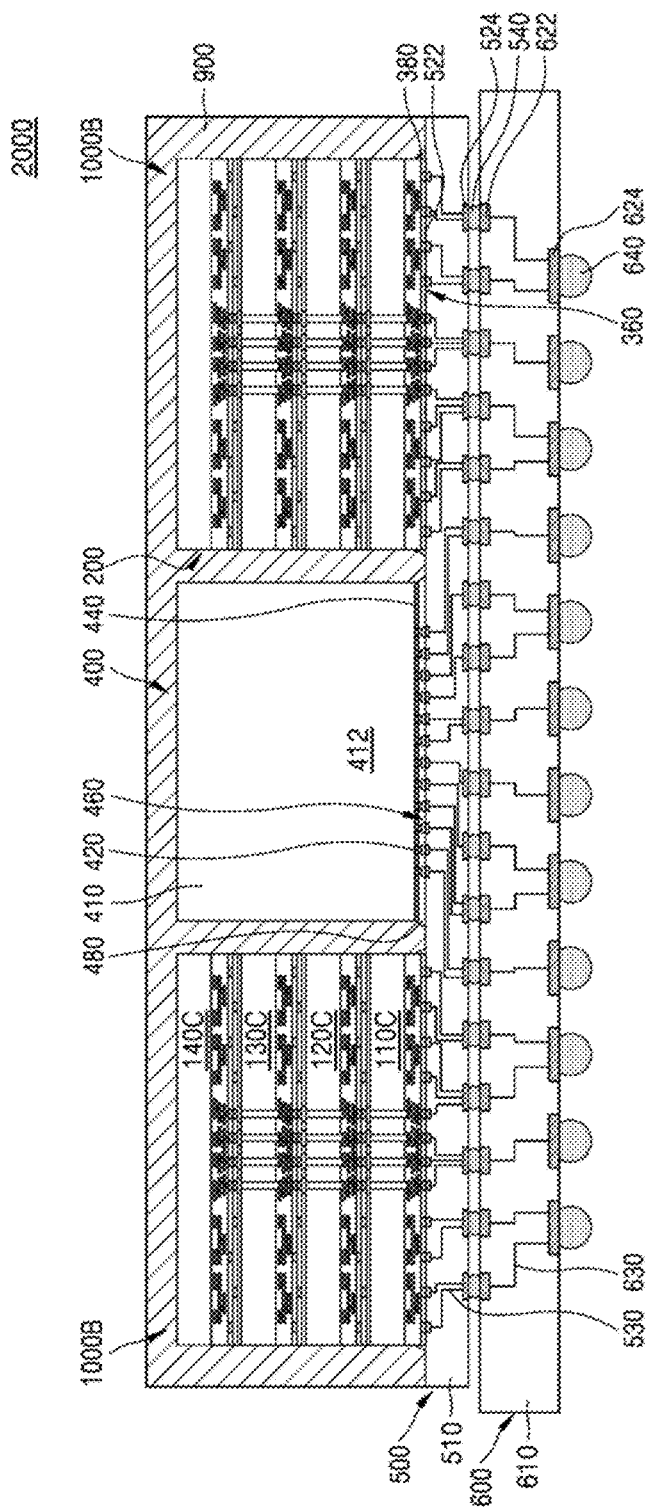
FIG. 24 is a cross-sectional view of a semiconductor package, according to an example embodiment of the inventive concept.

FIG. 24 is a cross-sectional view of a semiconductor package according to an example embodiment of the inventive concept.

Particularly, a semiconductor package 2000 may include the main board 600 on which the interposer 500 is mounted, a sub semiconductor package 1000B including the first through fourth semiconductor chips 110C, 120C, 130C, and 140C attached on the interposer 500, and a fifth semiconductor chip 400. The sub semiconductor package 1000B may be the semiconductor package 1000 described above. In addition, the second semiconductor 2000 may be referred to as a system.

Although FIG. 24 illustrates that the semiconductor package 2000 includes two sub semiconductor packages 1000B, it is not limited thereto. For example, the semiconductor package 2000 may include one sub semiconductor package 1000B or include three or more sub semiconductor packages 1000B.

The fifth semiconductor chip 400 may include a fifth substrate 410 in which a third semiconductor device 412 is formed in an active surface, a plurality of top surface connection pads 420, a front surface protection layer 440, and a plurality of connection bumps 460 attached on the plurality of top surface connection pads 420. The fifth semiconductor chip 400 may include, for example, a central processor unit (CPU) chip, a graphic processing unit (GPU) chip, or an application processor (AP) chip. Each of the plurality of top surface connection pads 420 may include at least one of aluminum, copper, and nickel.

The interposer 500 may include a base layer 510, a first top pad 522 and a first bottom pad 524 respectively on a top surface and a bottom surface of the base layer 510, and a first wiring path 530 configured to electrically connect the first top pad 522 and the first bottom pad 524 through the base layer 510.

The base layer 510 may include a semiconductor, glass, ceramic, or plastic. For example, the base layer 510 may include silicon. The first wiring path 530 may be a wiring layer connected to the first top pad 522 and/or the first bottom pad 524 on the top surface and/or the bottom pad of the base layer 510 and/or an internal through electrode configured to connect the first top pad 522 to the first bottom pad 524 in the base layer 510. A connection bump 360, which electrically connects the sub semiconductor package 1000B and the interposer 500, and a connection bump 460 electrically connecting the fifth semiconductor chip 400 and interposer 500 may be connected to the first top surface pad 522.

A first underfill layer 380 may be between the sub semiconductor package 1000B and the interposer, and a second underfill layer 480 may be between the fifth semiconductor chip 400 and the interposer 500. The first underfill layer 380 and the second underfill layer 480 may respectively cover the connection bumps 360 and 460.

The semiconductor package 2000 may further include a package molding layer 900 surrounding lateral surfaces of the sub semiconductor package 1000B and fifth semiconductor chip 400 on the interposer 500. The package molding layer 900 may include, for example, EMC. In some embodiments, the package molding layer 900 may cover top surfaces of the sub semiconductor package 1000B and fifth semiconductor chip 400. In other embodiments, the package molding layer 900 may not cover the top surfaces of the sub semiconductor package 1000B and fifth semiconductor chip 400.

For example, a heat-radiating member may be attached on the sub semiconductor package 1000B and the fifth semiconductor chip 400 having a thermal interface material (TIM) layer between. The TIM layer may include, for example, mineral oil, grease, gap filler putty, phase change gel, phase change material pads, or particle filled epoxy. The heat-radiating member may include, for example, a heat sink, a heat spreader, a heat pipe, or a liquid cooled cold plate. The board connection terminal 540 may be attached on the first bottom surface pad 524. The board connection terminal 540 may electrically connect the interposer 500 and main board 600.

The main board 600 may include a base board layer 610, a second top pad 622 and a second bottom pad 624 respectively on a top surface and a bottom surface of the base board layer 610, and a second wiring path configured to electrically connect the second top pad 622 to the second bottom pad 624 through the base board layer 610.

In some embodiments, the main board 600 may include a printed circuit board. For example, the main board 600 may include a multi-layer printed circuit board. The base board layer 610 may include at least one of phenol resin, epoxy region, and polyimide.

A solder resist layer (not shown) exposing the second top surface pad 622 and second bottom surface pad 624 may be formed respectively on a top surface and bottom surface of the base board layer 610. The board connection terminal 540 may be connected to the second top surface pad 622, and an external connection terminal 640 may be connected to the second bottom surface pad 624. The board connection terminal 540 may electrically connect the first bottom surface pad 524 and the second top surface pad 622. The external connection terminal 640 connected to the second bottom surface pad 624 may connect the semiconductor package 200 to the outside. In some embodiments, the semiconductor package 2000 may not include the main board 600, and the board connection terminal 540 of the interposer 500 may perform functions of the external connection terminal.

While the inventive concept has been particularly shown and described with reference to embodiments thereof, it will be understood that various changes in form and details may be made therein without departing from the spirit and scope of the following claims.

What is claimed is:

1. A semiconductor package comprising:
a first semiconductor chip;
a second semiconductor chip arranged above the first semiconductor chip; and
main pad structures and dummy pad structures between the first semiconductor chip and the second semiconductor chip,
wherein the main pad structures comprise first main pad structures apart from one another on the first semiconductor chip and second main pad structures apart from one another on the second semiconductor chip and bonded to the first main pad structures,
wherein the dummy pad structures comprise first dummy pad structures comprising first dummy pads that are arranged apart from one another on the first semiconductor chip and first dummy capping layers arranged on the first dummy pads, and second dummy pad structures comprising second dummy pads that are arranged apart from one another on the second semiconductor chip and second dummy capping layers arranged on the second dummy pads, and
wherein the first dummy capping layers of the first dummy pad structures are not bonded to the second dummy capping layers of the second dummy pad structures.

2. The semiconductor package of claim 1, wherein the first dummy pads and the second dummy pads comprise materials different from those of the first dummy capping layers and the second dummy capping layers.

3. The semiconductor package of claim 1,
wherein a first bonding insulating layer insulating the first dummy pads is further formed on the first semiconductor chip, the second dummy capping layers are bonded to the first bonding insulating layer,
wherein a second bonding insulating layer configured to insulate the second dummy pad structures is further formed on the second semiconductor chip, and
wherein the first dummy capping layers are not bonded to the second bonding insulating layer.

4. The semiconductor package of claim 1,
wherein each of the first dummy pad structures on the first semiconductor chip is configured to have a top width and a bottom width equal to each other, and
wherein each of the second dummy pad structures on the second semiconductor chip is configured to have a top width and a bottom width equal to each other.

5. The semiconductor package of claim 1,
wherein the first semiconductor chip comprises an uppermost portion including a first wiring layer, the first wiring layer is connected to the first dummy pad structures,
wherein the second semiconductor chip comprises an uppermost portion including a second wiring layer, and
wherein the second wiring layer is connected to the second dummy pad structures.

6. The semiconductor package of claim 1,
wherein the main pad structures are arranged in center regions of the first semiconductor chip and the second semiconductor chip in a plan view, and
wherein the dummy pad structures are arranged to surround the main pad structures in peripheral regions of the first semiconductor chip and the second semiconductor chip.

7. The semiconductor package of claim 1,
wherein the main pad structures are arranged in left and right regions of the first semiconductor chip and the second semiconductor chip in a plan view, and
wherein the dummy pad structures are arranged in a middle region between the left and right regions of the first semiconductor chip and the second semiconductor chip in the plan view.

8. The semiconductor package of claim 1,
wherein each of the first dummy pad structures is formed as a hollow pattern having an inner area from a plan view,
wherein each of the second dummy pad structures is formed as a solid pattern in the inner area of the hollow pattern included in each of the first dummy pad structures, and
wherein in the plan view, the hollow pattern and the solid pattern do not overlap.

9. The semiconductor package of claim 1, wherein the first dummy pad structures are arranged apart from one another in a plan view on the first semiconductor chip, the second dummy pad structures are apart from one another in the plan view on the second semiconductor chip and arranged between the first dummy pad structures, and the first dummy pad structures do not overlap with the second dummy pad structures in the plan view.

10. The semiconductor package of claim 1, wherein the first dummy pad structures and the second dummy pad structures are configured in polygonal patterns.

11. The semiconductor package of claim 1, wherein the first dummy pad structures and the second dummy pad structures are configured in linear patterns.

12. The semiconductor package of claim 1,
wherein the main pad structures are arranged in at least one region of left, right, upper, and lower portions of the first semiconductor chip and the second semiconductor chip in a plan view, and
wherein the dummy pad structures are in regions in which the main pad structures are not arranged in at least one of the left, right, upper, and lower portions of the first semiconductor chip and the second semiconductor chip in the plan view.

13. A semiconductor package comprising:
a first semiconductor chip;
a second semiconductor chip arranged on the first semiconductor chip; and
main pad structures and dummy pad structures between the first semiconductor chip and the second semiconductor chip,
wherein the main pad structures comprise:
first main pad structures comprising first main pads apart from one another on the first semiconductor chip and first main capping layers on the first main pads, and
second main pad structures comprising second main pads apart from one another on the second semiconductor chip and second main capping layers on the second main pads,
wherein the first main capping layers of the first main pad structures are bonded to the second main capping layers of the second main pad structures,
wherein the dummy pad structures comprise first dummy pad structures comprising first dummy pads placed apart from one another on the first semiconductor chip and first dummy capping layers placed on the first dummy pads, and second dummy pad structures comprising second dummy pads apart from one another on the second semiconductor chip and second dummy capping layers on the second dummy pads, and
wherein the first dummy capping layers of the first dummy pad structures are not bonded to the second dummy capping layers of the second dummy pad structures.

14. The semiconductor package of claim 13, wherein the first main pads comprise a material different from that of the first main capping layers, the second main pads comprise a material different from that of the second main capping layers, the first dummy pads comprise a material different from that of the first dummy capping layers, and the second dummy pads comprise a material different from that of the second dummy capping layers.

15. The semiconductor package of claim 13,
wherein each of the first main pad structures on the first semiconductor chip is configured to have a top width and a bottom width equal to each other, and
wherein each of the second main pad structures on the second semiconductor chip is configured to have a top width and a bottom width equal to each other.

16. The semiconductor package of claim 13, wherein a width of each of the first main pad structures and the second main pad structures is greater than a width of each of the first dummy pad structures and greater than a width of each of the second dummy pad structures.

17. The semiconductor package of claim 13, wherein the first main capping layers of the first main pad structures and the second main capping layers of the second main pad structures partially overlap and are bonded to each other in a plan view.

18. A semiconductor package comprising:
a first semiconductor chip;
a second semiconductor chip arranged on the first semiconductor chip;
main pad structures and dummy pad structures between the first semiconductor chip and the second semiconductor chip; and
bonding insulating layers between the first semiconductor chip and the second semiconductor chip and insulating the main pad structures and the dummy pad structures,
wherein the main pad structures comprise:
first main pad structures comprising first main pads placed apart from one another on the first semiconductor chip and first main capping layers on the first main pads, and
second main pad structures comprising second main pads placed apart from one another on the second semiconductor chip and second main capping layers on the second main pads,
wherein the first main capping layers of the first main pad structures are bonded to the second main capping layers of the second main pad structures,
wherein the dummy pad structures comprise:
first dummy pad structures comprising first dummy pads placed apart from one another on the first semiconductor chip and first dummy capping layers placed on the first dummy pads, and
second dummy pad structures comprising second dummy pads placed apart from one another on the second semiconductor chip and second dummy capping layers placed on the second dummy pads, and
wherein the bonding insulating layers comprise:
on the first semiconductor chip, a first bonding insulating layer insulating the first main pad structures and the first dummy pad structures, and
on the second semiconductor chip, a second bonding insulating layer insulating the second main pad structures and the second dummy pad structures,
wherein the second dummy capping layers are bonded to the first bonding insulating layer, and the first dummy capping layers are bonded to the second bonding insulating layer.

19. The semiconductor package of claim 18,
wherein each of the first dummy pad structures is configured to have a top width and a bottom width equal to each other, and
wherein each of the second dummy pad structures is configured to have a top width and a bottom width equal to each other.

20. The semiconductor package of claim 18, wherein the first dummy capping layers and the second dummy capping layers comprise a material different from that of the first dummy pads and the second dummy pads.

* * * * *